US010513777B2

(12) United States Patent
Iwasaki et al.

(10) Patent No.: US 10,513,777 B2
(45) Date of Patent: Dec. 24, 2019

(54) FILM FORMATION DEVICE

(71) Applicant: TOKYO ELECTRON LIMITED, Tokyo (JP)

(72) Inventors: Masahide Iwasaki, Miyagi (JP); Satoshi Yonekura, Miyagi (JP); Toshihiko Iwao, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1348 days.

(21) Appl. No.: 14/378,365

(22) PCT Filed: Feb. 12, 2013

(86) PCT No.: PCT/JP2013/053233
§ 371 (c)(1),
(2) Date: Aug. 13, 2014

(87) PCT Pub. No.: WO2013/122043
PCT Pub. Date: Aug. 22, 2013

(65) Prior Publication Data
US 2015/0007774 A1 Jan. 8, 2015

(30) Foreign Application Priority Data
Feb. 14, 2012 (JP) .................... 2012-029744

(51) Int. Cl.
C23C 16/50 (2006.01)
C23C 16/455 (2006.01)
(Continued)

(52) U.S. Cl.
CPC ........ C23C 16/50 (2013.01); C23C 16/45542 (2013.01); C23C 16/45548 (2013.01);
(Continued)

(58) Field of Classification Search
CPC .............. C23C 16/50; C23C 16/45548; C23C 16/45542; H01J 37/32834; H01J 37/3244;
(Continued)

(56) References Cited

U.S. PATENT DOCUMENTS

2011/0155056 A1* 6/2011 Kato ................. C23C 16/45538
118/719
2011/0212625 A1* 9/2011 Toyoda ............... C23C 16/4412
438/758

FOREIGN PATENT DOCUMENTS

JP 2005-141941 A 6/2005
JP 2010-157736 A 7/2010
(Continued)

OTHER PUBLICATIONS

International Search Report dated Apr. 2, 2013 in PCT/JP2013/053233.

Primary Examiner — Kambiz Zand
Assistant Examiner — Mirza Israr Javed
(74) Attorney, Agent, or Firm — Rothwell, Figg, Ernst & Manbeck, P.C.

(57) ABSTRACT

A processing chamber accommodating a mounting table includes a first region and a second region. As the mounting table rotates, a substrate mounting region of the mounting table moves in a circumferential direction around the axis to pass through the first region and the second region. A first gas supply unit supplies a precursor gas to the first region from an injection unit disposed to face the mounting table. An exhaust outlet exhausts an exhaust port formed to extend along a closed path surrounding the exhaust outlet. A second gas supply unit supplies purge gas from an injection port formed to extend along a closed path surrounding the exhaust port. A plasma generation unit generates plasma from a reaction gas in the second region. An angular range (Continued)

of the second region is larger than an angular range of the first region.

7 Claims, 18 Drawing Sheets

(51) Int. Cl.
*H01J 37/32* (2006.01)
*H01L 21/02* (2006.01)

(52) U.S. Cl.
CPC .... *H01J 37/3244* (2013.01); *H01J 37/32834* (2013.01); *H01L 21/0217* (2013.01); *H01L 21/0228* (2013.01); *H01L 21/02274* (2013.01)

(58) Field of Classification Search
CPC ........... H01L 21/0228; H01L 21/02274; H01L 21/0217
See application file for complete search history.

(56) References Cited

FOREIGN PATENT DOCUMENTS

| JP | 2010-239103 A | 10/2010 |
| JP | 2011-3912 A | 1/2011 |
| JP | 2011-134996 A | 7/2011 |
| JP | 2011-222960 A | 11/2011 |

* cited by examiner

FIG.12A

|  |  | Exhaust Amount (slm) | | | | | |
|---|---|---|---|---|---|---|---|
|  |  | 0 | 0.5 | 1 | 1.5 | 2 | 2.5 |
| Flow Rate of Purge Gas (slm) | 0 | --- | --- | 0 | --- | 0 | --- |
| | 0.5 | --- | --- | 0 | --- | 0 | --- |
| | 1 | --- | --- | 0 | --- | 0 | --- |
| | 1.5 | --- | --- | 0 | --- | 0 | --- |
| | 2 | --- | --- | 0 | --- | 0 | --- |
| | 2.5 | --- | --- | 0 | --- | 0 | --- |

FIG.12B

|  |  | Exhaust Amount (slm) | | | | | |
|---|---|---|---|---|---|---|---|
|  |  | 0 | 0.5 | 1 | 1.5 | 2 | 2.5 |
| Flow Rate of Purge Gas (slm) | 0 | --- | --- | --- | --- | 0 | --- |
| | 0.5 | --- | <0.2% | --- | --- | 0 | --- |
| | 1 | --- | 0 | 0 | --- | <0.5% | --- |
| | 1.5 | --- | 0 | 0 | --- | 0 | --- |
| | 2 | --- | 0 | 0 | --- | 0 | --- |
| | 2.5 | --- | 0 | 0 | --- | 0 | --- |

FIG.13A

|  |  | Exhaust Amount (slm) | | | | | |
|---|---|---|---|---|---|---|---|
|  |  | 0 | 0.5 | 1 | 1.5 | 2 | 2.5 |
| Flow Rate of Purge Gas (slm) | 0 | --- | --- | 0 | --- | 0 | --- |
|  | 0.5 | --- | --- | <0.2% | --- | 0 | --- |
|  | 1 | --- | --- | <0.2% | --- | 0 | --- |
|  | 1.5 | --- | --- | <0.2% | --- | 0 | --- |
|  | 2 | --- | --- | 0 | --- | 0 | --- |
|  | 2.5 | --- | --- | 0 | --- | 0 | --- |

FIG.13B

|  |  | Exhaust Amount (slm) | | | | | |
|---|---|---|---|---|---|---|---|
|  |  | 0 | 0.5 | 1 | 1.5 | 2 | 2.5 |
| Flow Rate of Purge Gas (slm) | 0 | --- | --- | --- | --- | --- | --- |
|  | 0.5 | --- | <0.5% | --- | --- | --- | --- |
|  | 1 | --- | <0.5% | <0.5% | --- | --- | --- |
|  | 1.5 | --- | <0.2% | <0.2% | --- | <0.5% | --- |
|  | 2 | --- | 0 | 0 | --- | <0.2% | --- |
|  | 2.5 | --- | 0 | 0 | --- | 0 | --- |

FIG.14A

| | | Exhaust Amount (slm) | | | | | |
|---|---|---|---|---|---|---|---|
| | | 0 | 0.5 | 1 | 1.5 | 2 | 2.5 |
| Flow Rate of Purge Gas (slm) | 0 | --- | --- | --- | <0.5% | 0 | 0 |
| | 0.5 | --- | --- | --- | --- | 0 | 0 |
| | 1 | --- | --- | --- | --- | <0.5% | 0 |
| | 1.5 | --- | --- | --- | --- | --- | <0.2% |
| | 2 | --- | --- | --- | --- | --- | <0.2% |
| | 2.5 | --- | --- | --- | --- | --- | <0.2% |

FIG.14B

| | | Exhaust Amount (slm) | | | | | |
|---|---|---|---|---|---|---|---|
| | | 0 | 0.5 | 1 | 1.5 | 2 | 2.5 |
| Flow Rate of Purge Gas (slm) | 0 | --- | --- | --- | --- | --- | --- |
| | 0.5 | --- | --- | --- | <0.5% | <0.5% | <0.5% |
| | 1 | --- | 0 | 0 | 0 | <0.2% | <0.2% |
| | 1.5 | --- | 0 | 0 | 0 | 0 | <0.2% |
| | 2 | --- | 0 | 0 | 0 | 0 | <0.2% |
| | 2.5 | --- | 0 | 0 | 0 | 0 | o |

FIG.15A

|  |  | Exhaust Amount (slm) | | | | | |
|---|---|---|---|---|---|---|---|
|  |  | 0 | 0.5 | 1 | 1.5 | 2 | 2.5 |
| Flow Rate of Purge Gas (slm) | 0 | — | — | 0 | 0 | 0 | 0 |
|  | 0.5 | — | — | 0 | 0 | 0 | 0 |
|  | 1 | — | — | 0 | 0 | 0 | 0 |
|  | 1.5 | — | — | 0 | 0 | 0 | 0 |
|  | 2 | — | — | 0 | 0 | 0 | 0 |
|  | 2.5 | — | — | 0 | 0 | 0 | 0 |

FIG.15B

|  |  | Exhaust Amount (slm) | | | | | |
|---|---|---|---|---|---|---|---|
|  |  | 0 | 0.5 | 1 | 1.5 | 2 | 2.5 |
| Flow Rate of Purge Gas (slm) | 0 | — | — | — | — | — | — |
|  | 0.5 | — | <0.5% | — | — | — | — |
|  | 1 | — | <0.2% | 0 | — | — | — |
|  | 1.5 | — | 0 | 0 | — | <0.2% | — |
|  | 2 | — | 0 | 0 | — | 0 | — |
|  | 2.5 | — | 0 | 0 | — | 0 | — |

FILM FORMATION DEVICE

CROSS REFERENCE TO RELATED APPLICATION

This application is a 35 U.S.C. 371 National Phase Entry Application from PCT/JP2013/053233, filed Feb. 12, 2013, which claims priority to Japanese Patent Application No. 2012-029744, filed Feb. 14, 2012, the disclosures of which are incorporated herein in their entirety by reference.

TECHNICAL FIELD

An exemplary embodiment of the present invention relates to a film formation device.

BACKGROUND ART

As a kind of a technique that forms a film on a substrate, a plasma-enhanced atomic layer deposition (PE-ALD) method is known. In the PE-ALD method, the substrate is exposed to a precursor gas to chemically adsorb the precursor gas containing a constituent element of a thin film to be formed on the substrate. Subsequently, the substrate is exposed to a purge gas to remove the precursor gas excessively chemically adsorbed to the substrate. In addition, the substrate is exposed to plasma of a reaction gas containing the constituent element of a thin film to be formed so as to form a desired thin film on the substrate. In the PE-ALD method, the above-described processes are repeated, and as a result, a film processed by atoms or molecules contained in the precursor gas is generated on the substrate.

As a device that performs the PE-ALD method, a single substrate type film formation device and a semi-batch type film formation device are known. The aforementioned process of the PE-ALD method is repeated in a single processing chamber for the single substrate type film formation device. That is, in the single substrate type film formation device, the precursor gas is supplied into the single processing chamber, subsequently, the purge gas is supplied into the processing chamber, then, the reaction gas is supplied into the processing chamber, and plasma of the reaction gas is generated. Further, in the single substrate type film formation device, the purge gas is supplied into the processing chamber after generation of the plasma of the reaction gas and before subsequent supply of precursor gas. In the single substrate type film formation device, the supply of the precursor gas, the supply of the purge gas, the generation of the plasma of the reaction gas, and the supply of the purge gas need to be performed in sequence temporally as described above. Thus, a throughput becomes comparatively lowered.

Meanwhile, in the semi-batch type film formation device, a precursor gas-supplied region and a reaction gas plasma generation region are separately formed in the processing chamber and a substrate moves to pass through the regions in sequence. In the semi-batch type film formation device, the supply of the precursor gas and the plasma generation of the reaction gas may be simultaneously performed in different regions. Thus, a throughput is higher than that of the single substrate type film formation device.

Semi-batch type film formation devices are disclosed in Patent Documents 1 and 2 described below. The film formation device disclosed in Patent Document 1 includes a susceptor unit and a gas injection unit. The susceptor unit supports a substrate and is configured to rotate around a rotational axis. The gas injection unit is disposed to face the susceptor unit and includes a first region for supplying the precursor gas, a purge region for supplying the purge gas, a second region for supplying radicals of the reaction gas, and a separate purge region for supplying the purge gas. The first region, the purge region, the second region, and the separate purge region are arranged in a circumferential direction and exhaust lines extending in a radial direction are installed between the respective regions. The exhaust lines and the purge regions contribute to separating the first region and the second region. In the film formation device disclosed in Patent Document 1, respective angular ranges of the first region, the second region, and two purge regions extending in the circumferential direction with respect to the rotational axis are substantially the same as each other.

Further, the film formation device disclosed in Patent Document 2 includes a rotary tray, a shower head, and a plasma source. The rotary tray supports a substrate and is rotatable around a rotational axis. The shower head and the plasma source are disposed to face the rotary tray and arranged in the circumferential direction. The shower head has a substantially a fan-shaped planar shape and supplies a precursor gas. The plasma source is also has a substantially fan-shaped planar shape. The plasma source supplies a reaction gas, and supplies high-frequency power from a comb-type electrode to generate the plasma of the reaction gas. Exhaust ports are formed around the shower head and the plasma source and a shower plate is installed between the shower head and the plasma source to supply the purge gas. In the film formation device disclosed in Patent Document 2, the angular ranges of the shower head and the plasma source extending in the circumferential direction with respect to the rotational axis are substantially equal to each other and an angular range of the shower plate extending in the circumferential direction with respect to the rotational axis is significantly larger than the angular ranges of the shower head and the plasma source.

PRIOR ART DOCUMENT

Patent Document

Patent Document 1: Japanese Patent Laid-Open Publication No. 2010-157736
Patent Document 2: Japanese Patent Laid-Open Publication No. 2011-222960

SUMMARY OF INVENTION

Technical Problem

As described above, in the film formation devices in the related art disclosed in Patent Documents 1 and 2, an angular range of a precursor gas-supplied region extending in a circumferential direction is substantially equal to an angular range of a reaction gas plasma generation region extending in a circumferential direction. Further, in the film formation devices in the related art, the angular range of the purge gas-supplied region extending in the circumferential direction is configured to be equal to or larger than the angular range of the precursor gas-supplied region extending in the circumferential direction and the angular range of the reaction gas radical generation region extending in the circumferential direction. Due to such a structure, in the film formation devices in the related art, a length of time required for one rotation of mounting tables, such as, for example, the rotary tray and the susceptor unit rotate, need to be set to be comparatively long in order to deposit a film having desired film quality.

Accordingly, what is requested in the technical field is a film formation device which is capable of forming a film with a higher throughput.

Technical Solution

A film formation device according to an aspect of the present invention includes; a mounting table; a processing container, a first gas supply unit, an exhaust outlet, a second gas supply unit, and a plasma generation unit. The mounting table includes a substrate mounting region. The mounting table is installed to be rotatable about an axis such that the substrate mounting region moves in a circumferential direction around the axis. The processing container defines a processing chamber accommodating the mounting table. The processing chamber includes a first region and a second region in which the substrate mounting region passes through the first region and the second region in this order while moving in the circumferential direction around the axis by rotation of the mounting table. The first gas supply unit supplies a precursor gas to the first region from an injection unit that installed to face the mounting table. The exhaust outlet performs exhaust of an exhaust port formed to extend along a closed path which surrounds a periphery of the exhaust unit. The second gas supply unit supplies a purge gas from an injection port formed to extend along a closed path which surrounds a periphery of the exhaust port. The plasma generation unit generates plasma of a reaction gas in the second region. In the film formation device, an angular range of the first region extending in the circumferential direction around the axis is larger than an angular range of the second region extending in the circumferential direction around the axis.

Herein, descriptions will be made on a principle capable of realizing a high throughput of film formation by the film formation device. A film quality of a film deposited on a substrate significantly relies on a length of time in which the substrate is exposed to the plasma of the reaction gas than a length of time in which the substrate is exposed to the precursor gas. That is, although the length of time in which the substrate is exposed to the precursor gas is set to be longer than a predetermined length of time, the film quality is not significantly influenced. However, when the length of time in which the substrate is exposed to the plasma is increased, a film having a more excellent film quality may be obtained. Meanwhile, the film quality may be evaluated by, for example, an etching speed of the film deposited on the substrate by a hydrofluoric acid solution. As the etching speed is lowered, the film quality may be evaluated as being excellent. In the film formation device, an angular range of the second region, in which the plasma of the reaction gas is generated, extending in the circumferential direction is set to be larger than an angular range of the first region, to which the precursor gas is supplied, extending in the circumferential direction. Thus, within a length of time in which the mounting table rotates one time, the length of time in which the substrate is exposed to the plasma of the reaction gas may be set to be relatively longer than the length of time in which the substrate is exposed to the precursor gas. Therefore, according to the film formation device, a film formation throughput may be improved.

Further, the film formation device has a structure in which an exhaust port having a narrow width surrounds the outer periphery of the injection unit of the precursor gas and further, the purge gas injection port having a narrow width surrounds the outer periphery of the exhaust port. In the exemplary embodiment, the substrate mounting region has a size corresponding to the size of the substrate, and the widths of the injection port and the exhaust port of the purge gas that extend between the injection unit of the precursor gas and the plasma generation unit may be smaller than a diameter of the substrate mounting region. Such a structure, that is, a structure in which the exhaust port and the injection port of the purge gas extend along a closed path around the injection unit of the precursor gas may contribute to suppressing infiltration of the plasma into the first region from the second region and infiltration of the precursor gas into the second region from the first region, and securing the angular range of the second region.

In an exemplary embodiment, the precursor gas injection unit includes a plurality of injection ports and the plurality of injection ports may be distributed between two edges which come closer to each other as approaching the axis. In an exemplary embodiment, the injection unit may be configured such that more precursor gas injection ports are formed as the distance from the axis is increased. A speed at each position on the substrate according to rotation of the mounting table is varied depending on a distance from the axis. That is, the speed at a position which is spaced relatively far away from the axis is relatively high. According to an exemplary embodiment, the injection unit is configured such that relatively more injection ports face the substrate at a position spaced relatively far away from the axis on the substrate. Thus, the variation in the length of time in which each position of the substrate is exposed to the precursor gas may be reduced.

In an exemplary embodiment, the plasma generation unit may include a third gas supply unit and one or more antennas. The third gas supply unit may supplies the reaction gas to the second region and one or more antennas may supply microwaves to the second region. Each of the one or more antennas may include a dielectric plate and at least one waveguides. The dielectric plate may be installed to face the mounting table with the second region interposed therebetween, the at least one waveguide may be installed on the dielectric plate, and a slot configured to allow the microwaves to pass therethrough toward the dielectric plate may be formed in the at least one waveguide. The dielectric plate may have a dielectric window contacting the second region, the dielectric window may include two edges, and two edges may extend in a direction which crosses the axis and come closer to each other as approaching the axis. In the exemplary embodiment, the plasma generation unit is configured such that as the distance from the axis is increased, the circumferential length of the region where the plasma is generated is increased. Therefore, the variation in the length of time in which each position of the substrate is exposed to the plasma of the reaction gas may be reduced.

In an exemplary embodiment, the plasma generation unit may have a plurality of antennas arranged in the circumferential direction as the one or more antennas. In another exemplary embodiment, the plasma generation unit may have a single antenna as the one or more antennas, and the single antenna may be installed on the single dielectric plate, and further, may include the plurality of waveguides arranged in the circumferential direction as the one or more waveguides. According to the exemplary embodiments, the intensity of the microwaves supplied to the second region may be increased.

In an exemplary embodiment, a gap may be formed between the exhaust port and the injection port of the second gas supply unit and the mounting table from and a distance between the exhaust port and the injection port of the second gas supply unit may be 10 or more times equal of the length of the gap. According to the exemplary embodiment, the infiltration of the plasma into the first region from the second region and the infiltration of the precursor gas into the second region from the first region are more reliably prevented. Further, the exhaust amount of the exhaust outlet and an allowance range of the supply amount of the purge gas of the second gas supply unit may be increased.

Advantageous Effects of Invention

As described above, according to one aspect and one exemplary embodiment of the present invention, a film formation device which is capable of forming a film with a higher throughput is provided.

BRIEF DESCRIPTION OF THE DRAWINGS

FIG. 12A is a table representing a leakage amount of gas to the outside of a first region R1 from the first region R1 and FIG. 12B is a table representing an infiltration amount of gas into the first region R1 from the outside of the first region R1 in which the leakage amount and the infiltration amount are measured while changing an exhaust amount of an exhaust device 34 and a flow rate of purge gas of a second gas supply unit 20 as parameters.

FIG. 13A is a table representing a leakage amount of gas to the outside of a first region R1 from the first region R1 and FIG. 13B is a table representing an infiltration amount of gas into the first region R1 from the outside of the first region R1 in which the leakage amount and the infiltration amount are measured while changing an exhaust amount of an exhaust device 34 and a flow rate of purge gas of a second gas supply unit 20 as parameters.

FIG. 14A is a table representing a leakage amount of gas to the outside a first region R1 and FIG. 14B is a table representing an infiltration amount of gas into the first region R1 from the outside of the first region R1 in which the leakage amount and the infiltration amount are measured while changing an exhaust amount of an exhaust device 34 and a flow rate of purge gas of a second gas supply unit 20 as parameters.

FIG. 15A is a table representing a leakage amount of gas to the outside a first region R1 and FIG. 15B is a table representing an infiltration amount of gas into the first region R1 from the outside of the first region R1 in which the leakage amount and the infiltration amount are measured while changing an exhaust amount of an exhaust device 34 and a flow rate of purge gas of a second gas supply unit 20 as parameters.

DETAILED DESCRIPTION TO EXECUTE THE INVENTION

Figure 1:
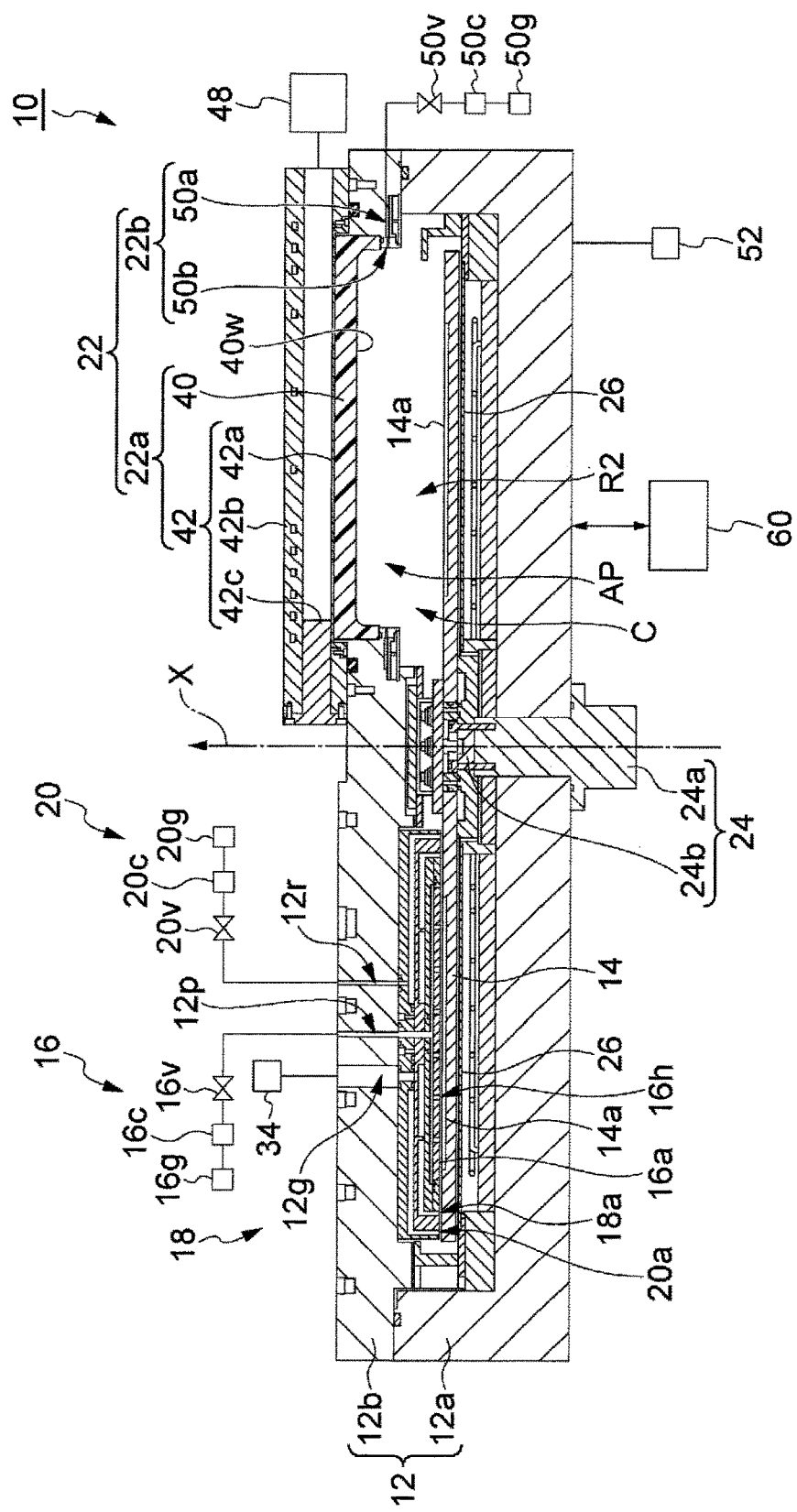
FIG. 1 is a cross-sectional view schematically illustrating a film formation device according to an exemplary embodiment.

Hereinafter, exemplary embodiments of the present invention will be described in detail with reference to the accompanying drawings. Further, in the drawings, like or similar portions will be designated by like reference numerals.

Figure 2:
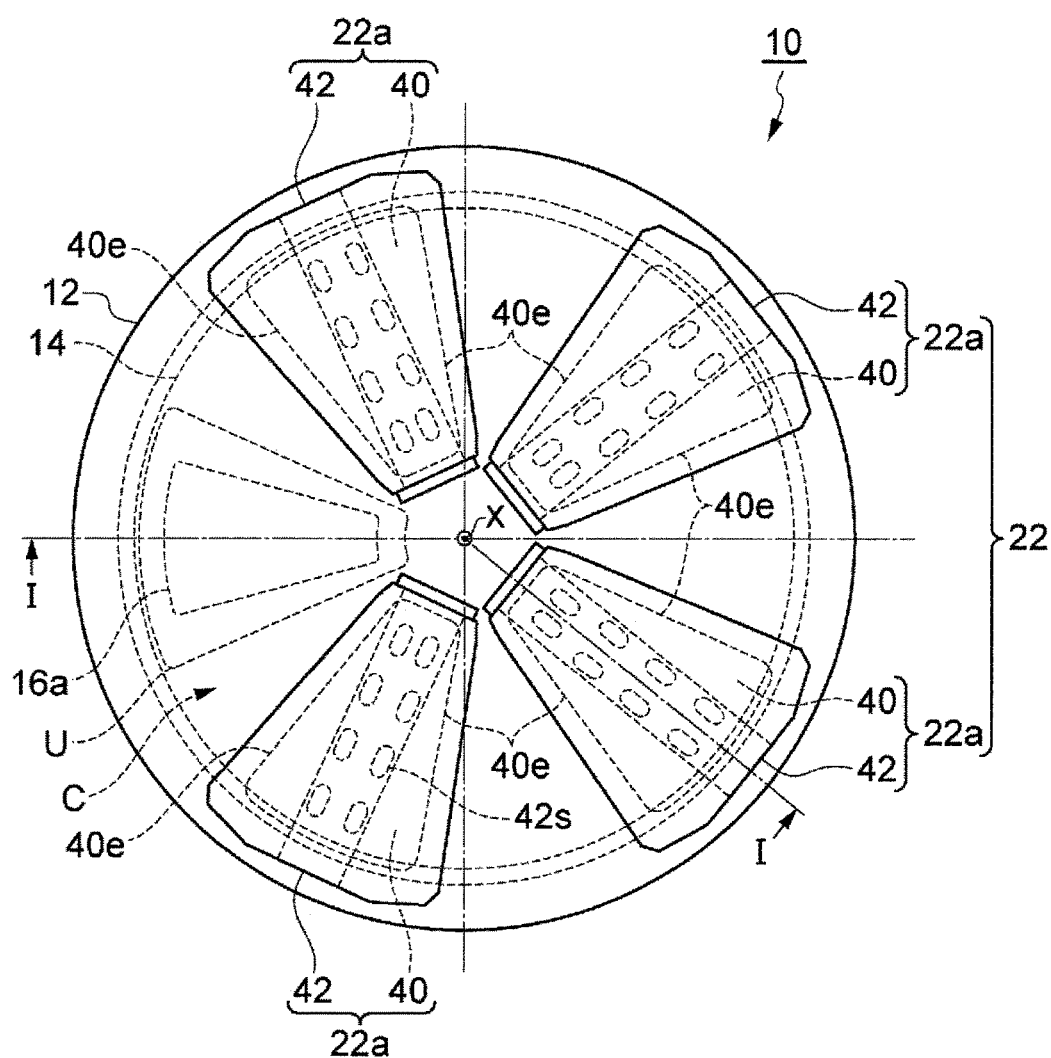
FIG. 2 is a top plan view schematically illustrating a film formation device according to an exemplary embodiment.
Figure 3:
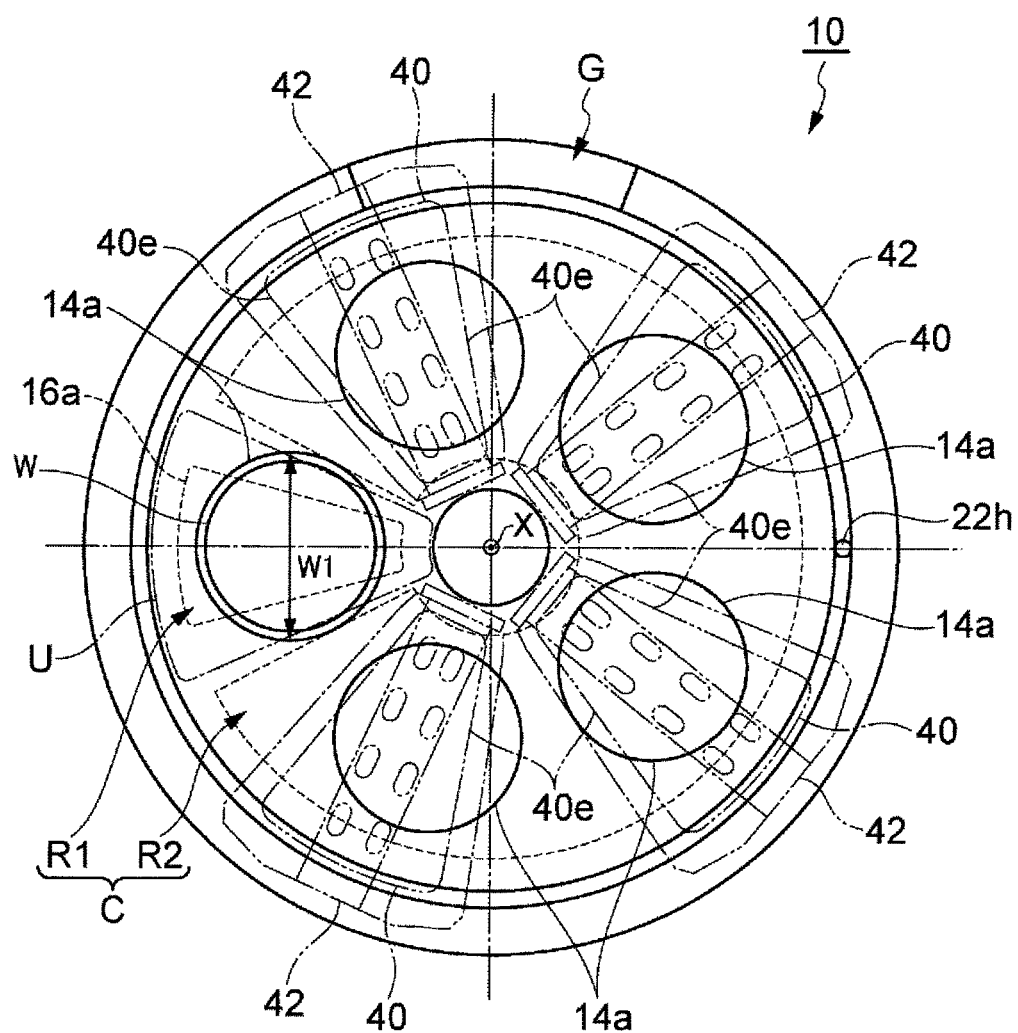
FIG. 3 is a plan view illustrating the film formation device illustrated in FIG. 2 in a state in which the top of a processing container is removed from the film formation device.

FIG. 1 is a cross-sectional view illustrating a film formation device according to an exemplary embodiment. FIG. 2 is a top plan view schematically illustrating a film formation device according to an exemplary embodiment. FIG. 1 illustrates a cross section taken along line I-I of FIG. 2. FIG. 3 is a plan view illustrating the film formation device illustrated in FIG. 2 in a state in which the top of a processing container is removed from the film formation device. A film formation device 10 illustrated in FIGS. 1, 2, and 3 includes a processing container 12, a mounting table 14, a first gas supply unit 16, an exhaust outlet 18, a second gas supply unit 20, and a plasma generation unit 22.

The processing container 12 is a substantially cylindrical container extending in an axial (X) direction. The processing container 12 defines a processing chamber C therein. The processing container 12 may be made of, for example, a metal such as, for example, aluminum, in which an anti-plasma processing (e.g., an alumite processing or spraying of $Y_2O_3$) is executed on an inner surface thereof. In an exemplary embodiment, as illustrated in FIG. 1, the processing container 12 includes a lower portion 12a and an upper portion 12b. The lower portion 12a has an upwardly-opened cylindrical shape, and includes a side wall and a bottom wall which define the processing chamber C. The upper portion 12b is a cover which defines the processing chamber C from the top. The upper portion 12b is attached to the top of the lower portion 12a so as to close an upper opening of the lower portion 12a. An elastic sealing member for sealing the processing chamber C may be installed between the lower portion 12a and the upper portion 12b.

The mounting table 14 is installed in the processing chamber C defined by the processing container 12. The mounting table 14 substantially has a disk shape. The mounting table 14 is configured to be rotatable around an axis X. In the exemplary embodiment, the mounting table 14 is rotatably driven around the axis X by a driving mechanism 24. The driving mechanism 24 has a driving device 24a such as, for example, a motor, and a rotation shaft 24b, and is attached to the lower portion 12a of the processing container 12. The rotation shaft 24b extends to the inside of the processing chamber C with the axis X as a central axis, and rotates around the axis X by the driving force from the driving device 24a. The central portion of the mounting table 14 is supported on the rotation shaft 24b. As a result, the mounting table 14 rotates about the axis X. Further, an elastic sealing member such as, for example, an O ring, may be installed between the lower portion 12a of the processing container 12 and the driving mechanism 24 so as to seal the processing chamber C.

As illustrated in FIGS. 1 and 3, one or more substrate mounting regions 14a are formed on the top surface of the mounting table 14. In the exemplary embodiment, the plurality of substrate mounting regions 14a is arrayed in a circumferential direction with respect to the axis X. Each substrate mounting region 14a is configured as a concave portion which has substantially the same diameter as that of a substrate W disposed in the region or a slightly larger diameter than that of the substrate W. Heaters 26 for heating the substrates W disposed in the substrate mounting regions 14a are installed below the mounting table 14 in the processing chamber C. The substrates W are transported to the processing chamber C by a transporting apparatus such as, for example, a robot arm, through a gate valve G installed in the processing container 12, and disposed in the substrate mounting region 14a. Further, the substrates W processed by the film formation apparatus 10 are taken out from the processing chamber C through the gate valve G by the transporting apparatus. The processing chamber C includes a first region R1 and a second region R2 which are arrayed in the circumferential direction with respect to the axis X. Accordingly, the substrates W disposed in the substrate mounting regions 14a sequentially pass through the first region R1 and the second region R2 according to the rotation of the mounting table 14.

Figure 4:
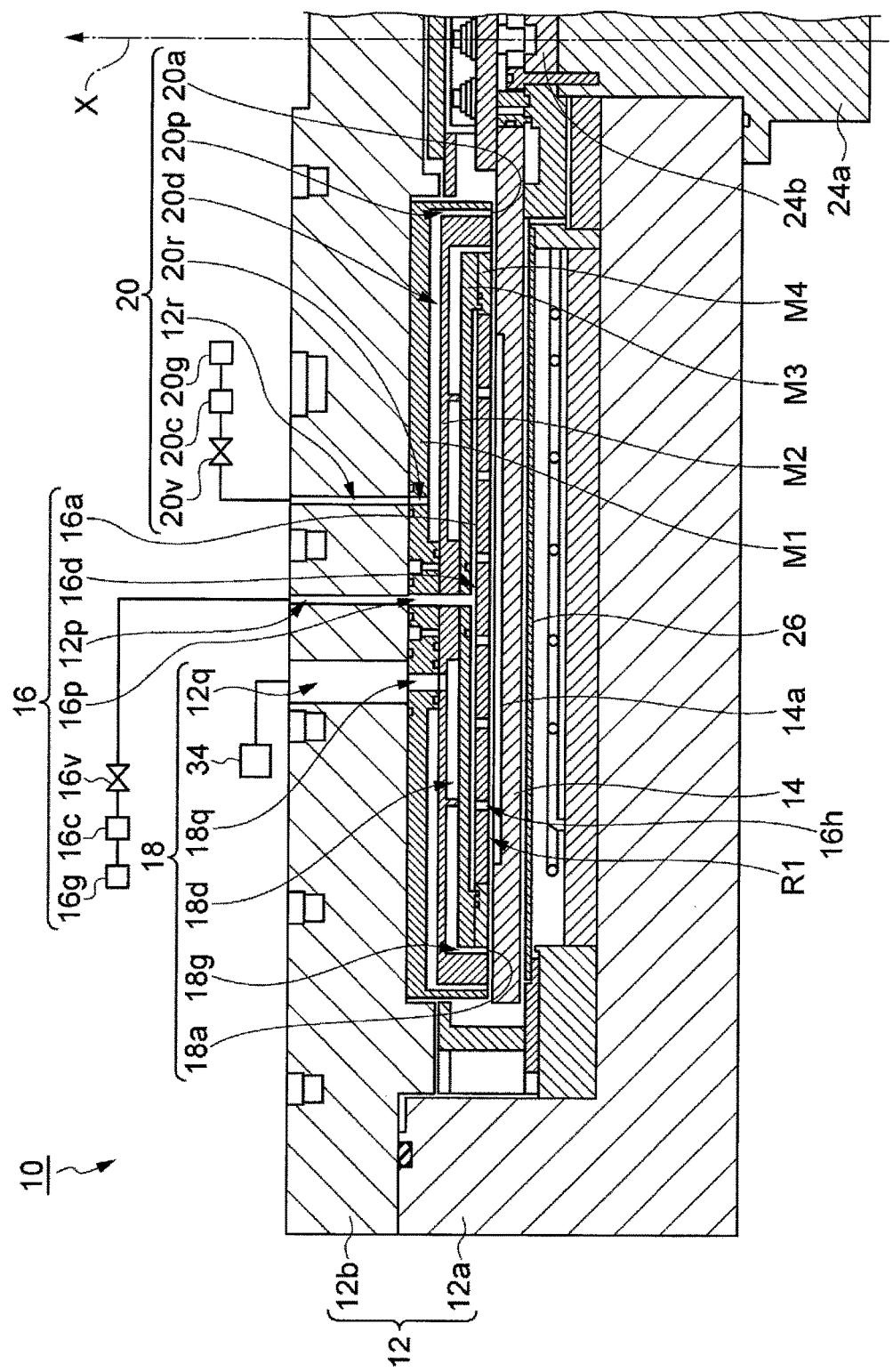
FIG. 4 is an enlarged cross-sectional view of the film formation device illustrated in FIG. 1 in which a part where an injection unit of a first gas supply unit, an exhaust port of an exhaust outlet, and an injection port of a second gas supply unit are formed is illustrated in an enlarged cross-sectional view.
Figure 5:
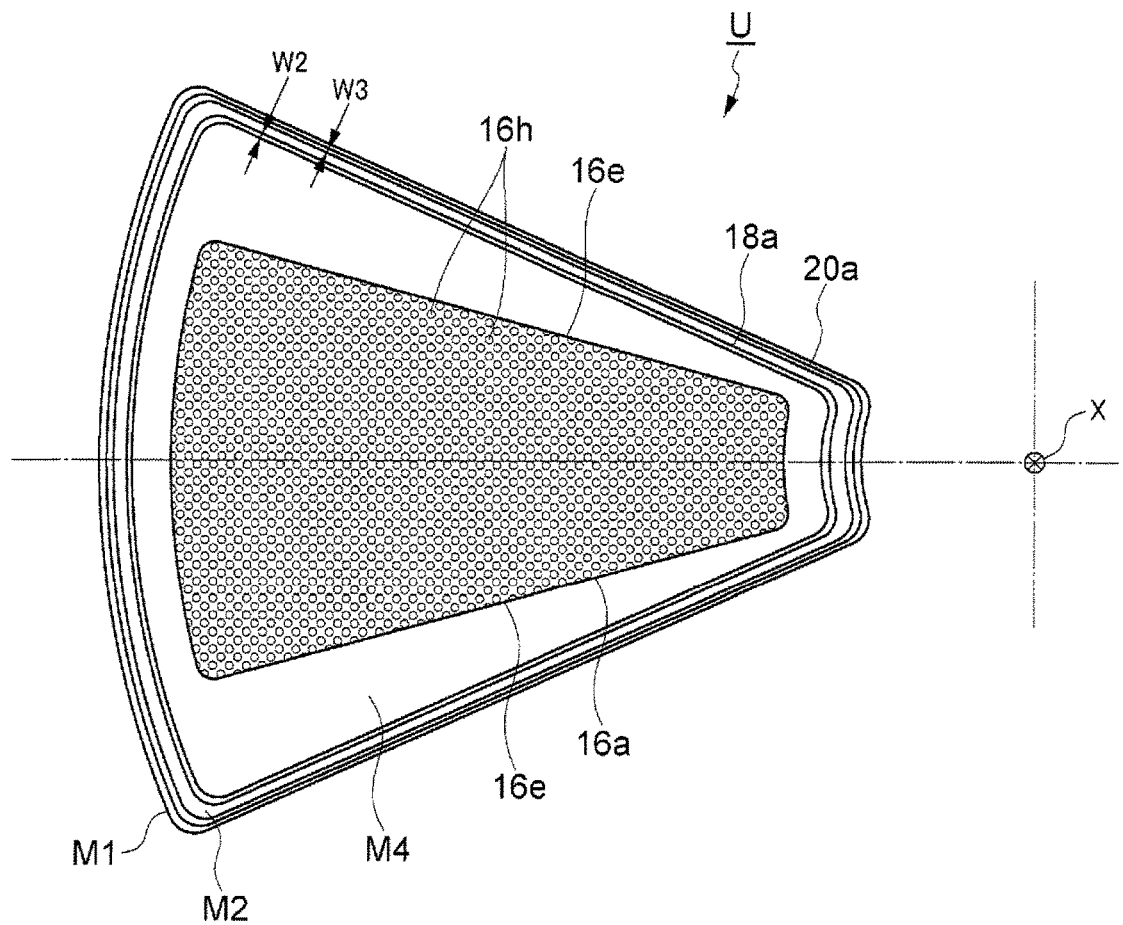
FIG. 5 is a plan view illustrating the injection unit of the first gas supply unit, the exhaust port of the exhaust outlet, and the injection port of the second gas supply unit of the film formation device illustrated in FIG. 1.

Hereinafter, reference will also be made to FIGS. 4 and 5 in addition to FIGS. 2 and 3. FIG. 4 is an enlarged cross-sectional view of the film formation device illustrated in FIG. 1, in which a part where an injection unit of the first gas supply unit, an exhaust port of the exhaust outlet, and an injection port of the second gas supply unit are formed is illustrated in an enlarged cross-sectional view. FIG. 5 is a plan view illustrating the injection unit of the first gas supply unit, the exhaust port of the exhaust outlet, and the injection port of the second gas supply unit of the film formation device illustrated in FIG. 1, in which the injection unit of the first gas supply unit, the exhaust port of the exhaust outlet, and the injection port of the second gas supply unit are viewed from the bottom, that is, the mounting table side. As illustrated in FIGS. 2 to 4, an injection unit 16a of the first gas supply unit 16 is installed above the first region R1 so as to face the upper surface of the mounting table 14. In other words, a region facing the injection unit 16a among the regions included in the processing chamber C becomes the first region R1.

As illustrated in FIGS. 4 and 5, a plurality of injection ports 16h is formed in the injection unit 16a. The first gas supply unit 16 supplies a precursor gas to the first region R1 from the plurality of injection ports 16h. The precursor gas is supplied to the first region R1, and thus the precursor gas is chemically adsorbed on the surface of the substrate W passing through the first region R1. As for the precursor gas, for example, dichlorosilane (DCS), monosilane, disilane, an organic silicon-containing material, or a metal-containing material, may be exemplified.

In an exemplary embodiment, as illustrated in FIG. 5, two edges 16e defining the injection unit 16a from the circumferential direction are included in the edges defining the injection unit 16a. The two edges 16e extends to come closer to each other as they approach the axis X. The two edges 16e may extend, for example, in a radial direction with respect to the axis X. That is, the injection unit 16a may have a substantially fan-shaped planar shape. The plurality of injection ports 16h may extend between the two edges 16e. Here, a speed at each position on the substrate W according to the rotation of the mounting table 14 is varied depending on a distance from the axis X. That is, a speed at a position which is spaced relatively far away from the axis X becomes relatively high. In an exemplary embodiment, the injection unit 16a is configured to face more injection ports 16h at a position which is farther away from the axis X in the substrate W. Accordingly, the variation in the length of time in which each position of the substrate W is exposed to the precursor gas may be reduced.

As illustrated in FIGS. 4 and 5, the exhaust port 18a is formed around the injection unit 16a, and the exhaust outlet 18 performs exhaust of the first region R1 from the exhaust port 18a. The exhaust port 18a of the exhaust outlet 18 faces the top surface of the mounting table 14, and as illustrated in FIG. 5, extends along a closed path which surrounds the outer periphery of the injection unit 16a. As such, in the film formation device 10, the narrow exhaust port 18a surrounds the periphery of the injection unit 16a.

Further, as illustrated in FIGS. 4 and 5, an injection port 20a of the second gas supply unit 20 is formed around the exhaust port 18a, and the second gas supply unit 20 injects the purge gas from the injection port 20a. The injection port 20a of the second gas supply unit 20 faces the top surface of the mounting table 14, and extends along the closed path which surrounds the outer circumference of the exhaust port 18a. As for the purge gas supplied by the second gas supply unit 20, an inert gas such as, for example, $N_2$ gas and Ar gas, may be used. When the purge gas is injected to the substrate W, the precursor gas which is excessively chemically-adsorbed on the substrate W is removed from the substrate W.

In the film formation device 10, by the exhaust from the exhaust port 18a and the injection of the purge gas from the injection port 20a, the precursor gas supplied to the first region R1 is suppressed from leaking out to the outside of the first region R1, and further, in the second region R2, a reaction gas or radicals thereof supplied as described below are suppressed from penetrating into the first region R1. That is, the exhaust outlet 18 and the second gas supply unit 20 separate the first region R1 and the second region R2. Further, since the injection port 20a and the exhaust port 18a have band-shaped planar shapes extending along the closed path which surrounds the outer periphery of the injection unit 16a, the width of each of the injection port 20a and the exhaust port 18a is narrowed. Accordingly, the separation of the first region R1 and the second region R2 is implemented while securing the angular range of the second regions R2 extending in the circumferential direction with respect to the axis X. In an exemplary embodiment, a width W2 of the exhaust port 18a extending between the first region R1 and the second region R2 and a width W3 of the injection port 20a (see, for example, FIG. 5) are smaller than a diameter W1 of the substrate mounting regions 14a (see, for example, FIG. 3).

Figure 6:
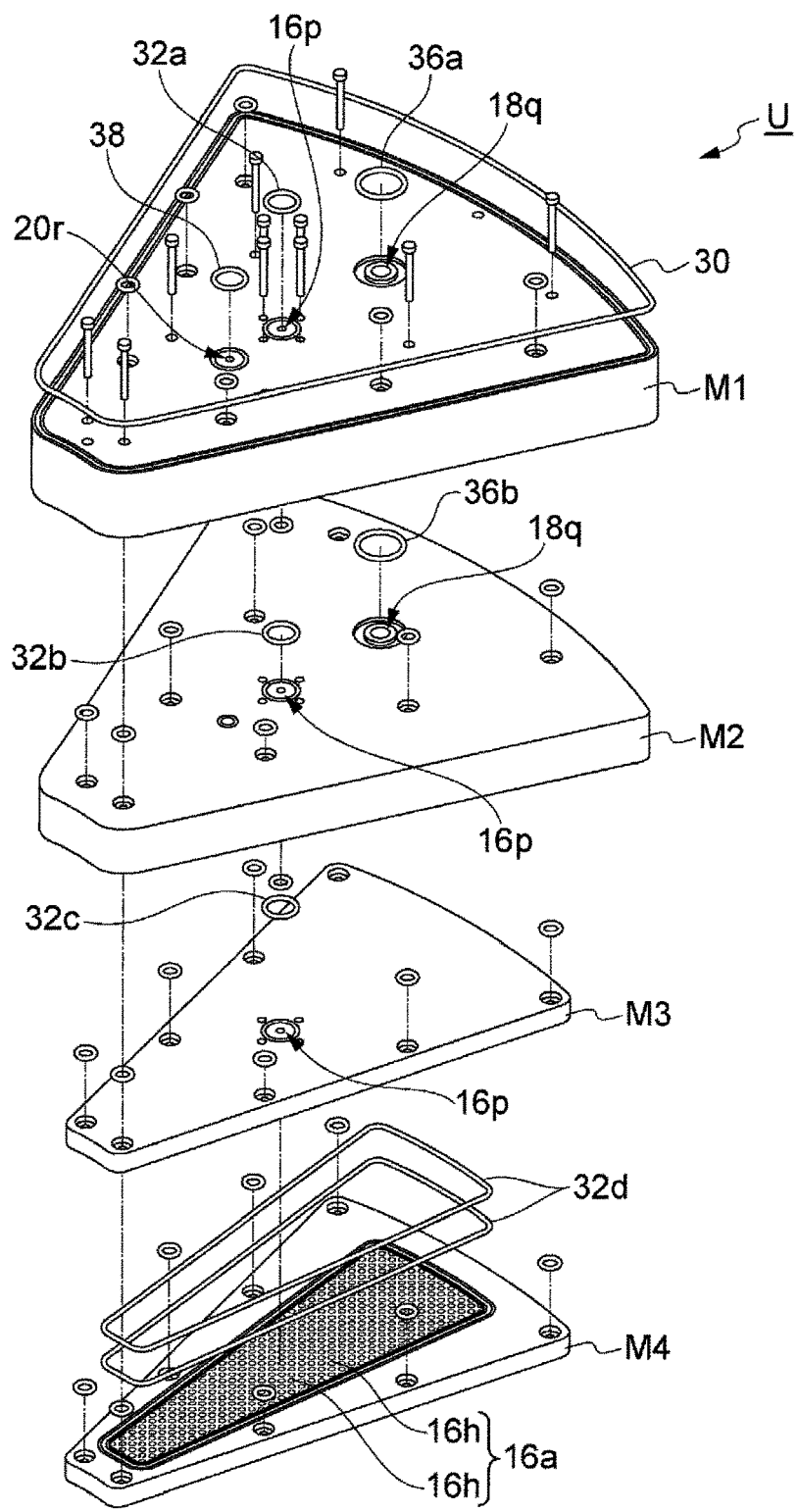
FIG. 6 is an exploded perspective view illustrating a unit related to an exemplary embodiment, which defines the injection unit of the first gas supply unit, the exhaust port of the exhaust outlet, and the injection port of the second gas supply unit.
Figure 7:
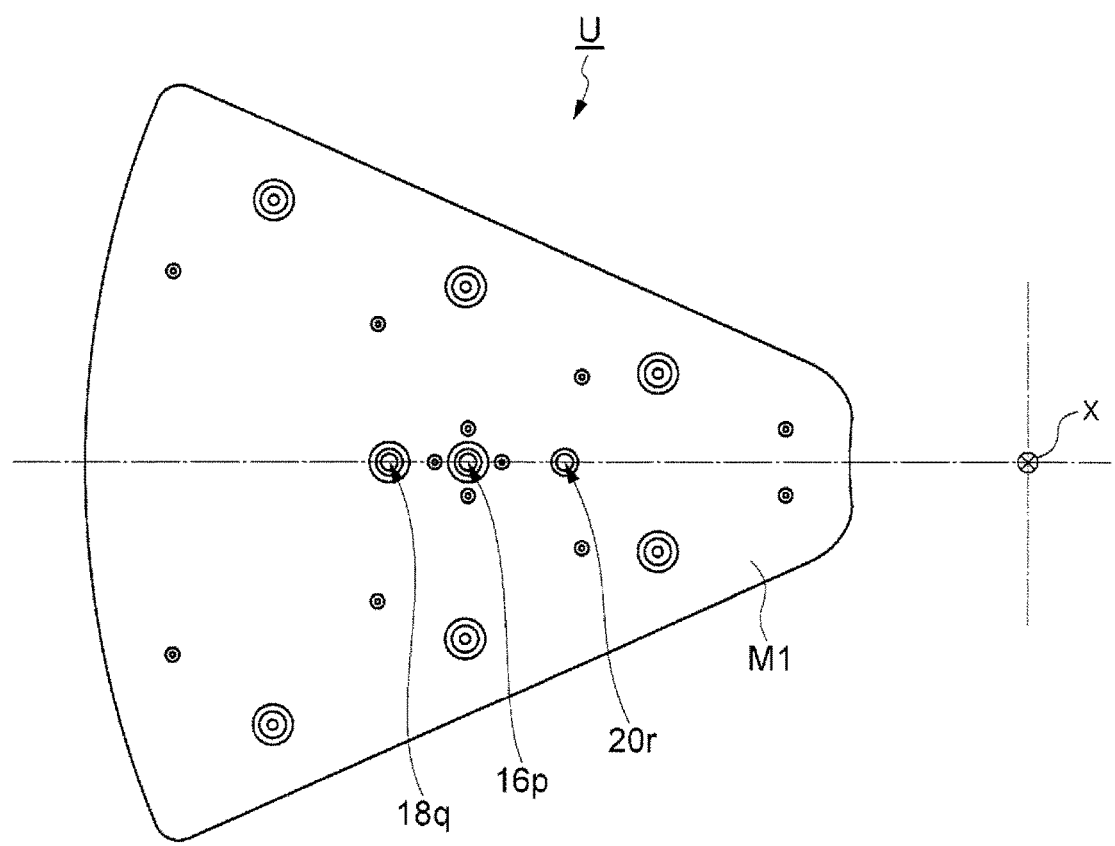
FIG. 7 is a plan view illustrating the unit illustrated in FIG. 6, which is viewed from the top.

In an exemplary embodiment, the film formation device 10 may include a unit U which defines the injection unit 16a, the exhaust port 18a, and the injection port 20a. Hereinafter, the exemplary embodiment will be described with reference to FIGS. 6 and 7. FIG. 6 is an exploded perspective view of the unit according to an exemplary embodiment, which defines the injection unit of the first gas supply unit, the exhaust port of the exhaust outlet, and the injection port of the second gas supply unit. FIG. 7 is a plan view of the unit illustrated in FIG. 6, which is viewed from the top. Further, FIG. 7 illustrates the top surface of the unit U, and FIG. 5 illustrates the bottom surface of the unit U. As illustrated in FIGS. 4 to 7, the unit U is configured by a first member M1, a second member M2, a third member M3, and a fourth member M4, and the first to fourth members M1 to M4 are piled up in this order from the top. The unit U is attached to the processing container 12 to be in contact with the bottom surface of the upper portion 12b of the processing container 12, and an elastic sealing member 30 is installed between the bottom surface of the upper portion 12b of the processing container 12 and the first member M1. The elastic sealing member 30 extends along an outer edge of the top surface of the first member M1.

The first to fourth members M1 to M4 have a substantially fan-shaped planar shape. The first member M1 defines a concave portion, in which the second to forth members M2 to M4 are received, at the lower side thereof. Further, the second member M2 defines a concave portion, in which the third and fourth members M3 to M4 are received, at the lower side thereof. The third member M3 and the fourth member M4 have substantially the same planar size.

In the unit U, a gas supply path 16p is formed to pass through the first to third members M1 to M3. The gas supply path 16p is connected with a gas supply path 12p formed in the upper portion 12b of the processing container 12, at an upper end thereof. A gas source 16g of the precursor gas is connected to the gas supply path 12p via a valve 16v and a flow rate controller 16c such as, for example, a mass flow rate controller. Further, a lower end of the gas supply path 16p is connected to a space 16d formed between the third member M3 and the fourth member M4. An injection port 16h of an injection unit 16a formed in the fourth member M4 is connected to the space 16d.

An elastic sealing member 32a such as an O ring is installed between the upper portion 12b of the processing container 12 and the first member M1 to surround a connection portion of the gas supply path 12p and the gas supply path 16p. The elastic sealing member 32a may prevent the precursor gas supplied to the gas supply path 16p and the gas supply path 12p from leaking out from a boundary of the upper portion 12b of the processing container 12 and the first member M1. Further, elastic sealing members 32b and 32c such as O rings are installed between the first member M1 and the second member M2 and between the second member M2 and the third member M3 to surround the gas supply path 16p, respectively. The elastic sealing members 32b and 32c may prevent the precursor gas supplied to the gas supply path 16p from leaking out from a boundary between the first member M1 and the second member M2 and a boundary between the second member M2 and the third member M3. Further, an elastic sealing member 32d is installed between the third member M3 and the fourth member M4 to surround a space 16d. The elastic sealing member 32d may prevent the precursor gas supplied to the space 16d from leaking out from a boundary between the third member M3 and the fourth member M4.

Further, in the unit U, an exhaust path 18q is formed to pass through the first and second members M1 and M2. The exhaust path 18q is connected, at the upper end thereof, with an exhaust path 12q formed in the upper portion 12b of the processing container 12. The exhaust path 12q is connected to an exhaust device 34 such as, for example, a vacuum pump. Further, the exhaust path 18q is connected, at the lower end thereof, to a space 18d formed between the bottom surface of the second member M2 and the top surface of the third member M3. Further, as described above, the second member M2 defines a concave portion which receives the third member M3 and the fourth member M4, and a gap 18g is formed between an inner surface of the second member M2 defining the concave portion and side end surfaces of the third member M3 and the fourth member M4. The space 18d is connected to the gap 18g. The lower end of the gap 18g functions as the above-described exhaust port 18a.

An elastic sealing member 36a such as, for example, an O ring, is installed between the upper portion 12b of the processing container 12 and the first member M1 to surround a connection portion of the exhaust path 18q and the exhaust path 12q. The elastic sealing member 36a may prevent exhaust gas passing through the exhaust path 18q and the exhaust path 12q from leaking out from a boundary between the upper portion 12b of the processing container 12 and the first member M1. Further, an elastic sealing member 36b such as, for example, an O ring, is installed between the first member M1 and the second member M2 to surround the exhaust path 18q. The elastic sealing member 32b may prevent the gas passing through the exhaust path 18q from leaking out from the boundary between the first member M1 and the second member M2.

Further, in the unit U, a gas supply path 20r is formed to pass through the first member M1. The gas supply path 20r is connected, at an upper end thereof, with a gas supply path 12r formed in the upper portion 12b of the processing container 12. A gas source 20g of the purge gas is connected to the gas supply path 12r via a valve 20v and a flow rate controller 20c such as, for example, a mass flow rate controller. Further, a lower end of the gas supply path 20r is connected to a space 20d formed between the lower surface of the first member M1 and the upper surface of the second member M2. Further, as described above, the first member M1 defines the concave portion which receives the second to fourth members M2 to M4, and a gap 20p is formed between the inner surface of the first member M1 defining the concave portion and a side surface of the second member M2. The gap 20p is connected to the space 20d. Further, a lower end of the gap 20p functions as the injection port 20a of the second gas supply unit 20. An elastic sealing member 38 such as, for example, an O ring is installed between the upper portion 12b of the processing container 12 and the first member M1 to surround a connection portion of the gas supply path 12r and the gas supply path 20r. The elastic sealing member 38 prevents the purge gas passing through the gas supply path 20r and the gas supply path 12r from leaking out from a boundary between the upper portion 12b and the first member M1.

Figure 8:
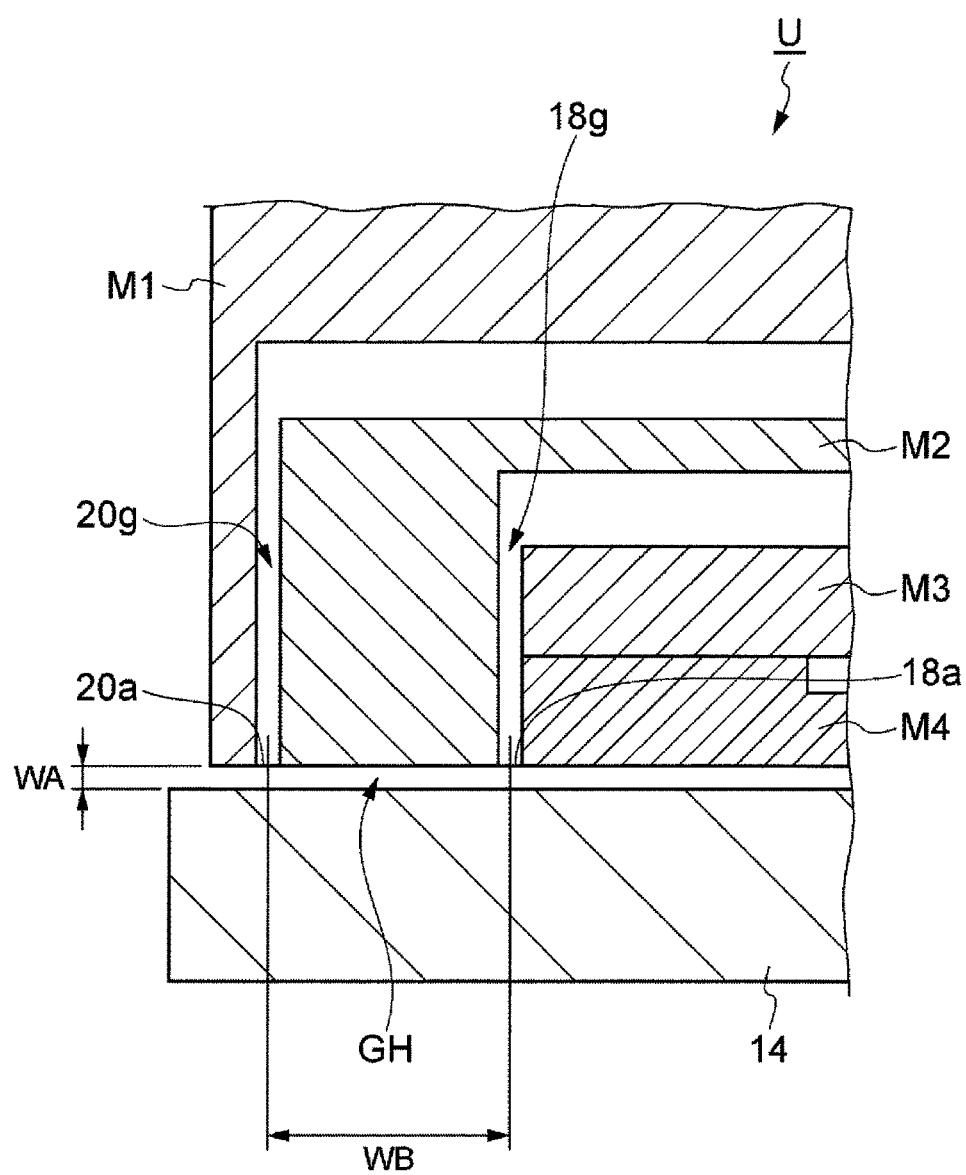
FIG. 8 is an enlarged cross-sectional view illustrating the injection port of the second gas supply unit and the exhaust port of the exhaust outlet illustrated in FIG. 4 and a mounting table.

Here, as illustrated in FIG. 8, a gap GH is formed between the bottom surface of the unit U and the top surface of the mounting table 14 so that the rotation of the mounting table 14 is not hindered. That is, between the top surface of the mounting table 14 and the injection port 20a and between the top surface of the mounting table 14 and the exhaust port 18a, the gap GH having a length (height) WA exists in the axial X direction. Further, a distance (pitch) between the exhaust port 18a and the injection port 20a has a length of a distance WB. The distance WB may be set to ten or more times of the length WA of the gap GH. The reason will be described below.

Figure 9:
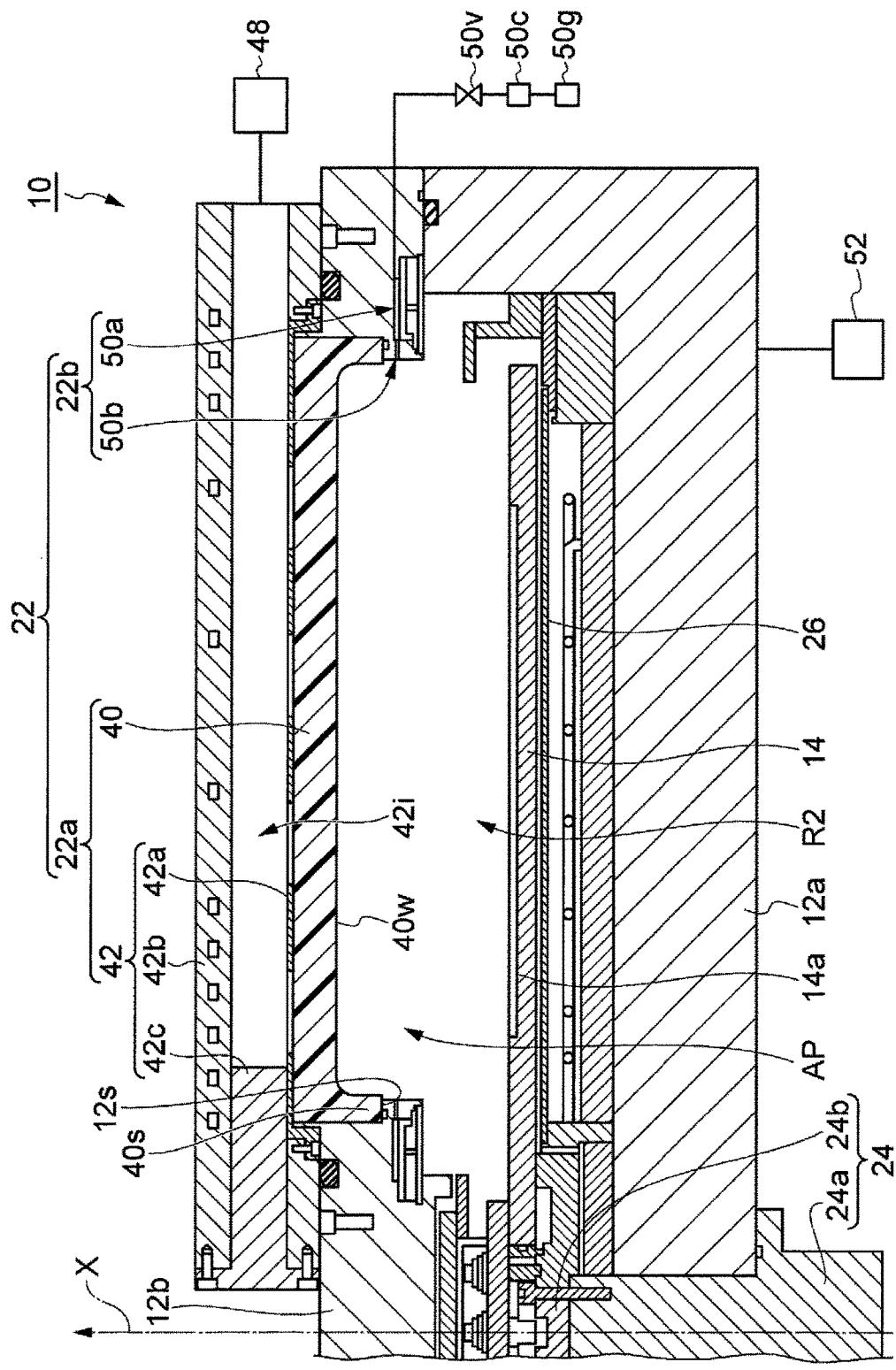
FIG. 9 is an enlarged cross-sectional view illustrating the film formation device illustrated in FIG. 1 in which a part where a plasma generation unit is installed is illustrated in an enlarged cross-sectional view.

Hereinafter, reference will be made to FIGS. 1 to 3 again and reference will also be made to FIG. 9. FIG. 9 is an enlarged cross-sectional view of the film formation device illustrated in FIG. 1 in which a part where a plasma generation unit is installed is illustrated in an enlarged cross-sectional view. As illustrated in FIGS. 1 to 3 and 9, the film formation device 10 includes a plasma generation unit 22. The plasma generation unit 22 generates plasma of a reaction gas in the second region R2 by supplying the reaction gas to the second region R2 and supplying microwaves to the second region R2. In an exemplary embodiment, the precursor gas chemically adsorbed on the substrate W may be nitrified in the second region R2. In the case where a film deposited on the substrate W is nitrified, for example, $N_2$ gas, $NH_3$ gas, oxygen, ozone, hydrogen, NO, or $NO_2$, may be used as the reaction gas.

The plasma generation unit 22 may have one or more antennas 22a configured to supply microwaves to the second region R2. Each of the antennas 22a may include a dielectric plate 40 and one or more waveguides 42. In the exemplary embodiment illustrated in FIGS. 1 to 3, four antennas 22a are arrayed in the circumferential direction with respect to the axis X. Each antenna 22a has a dielectric plate 40 installed above the second region R2 and a waveguide 42 installed on the dielectric plate 40.

Figure 10:
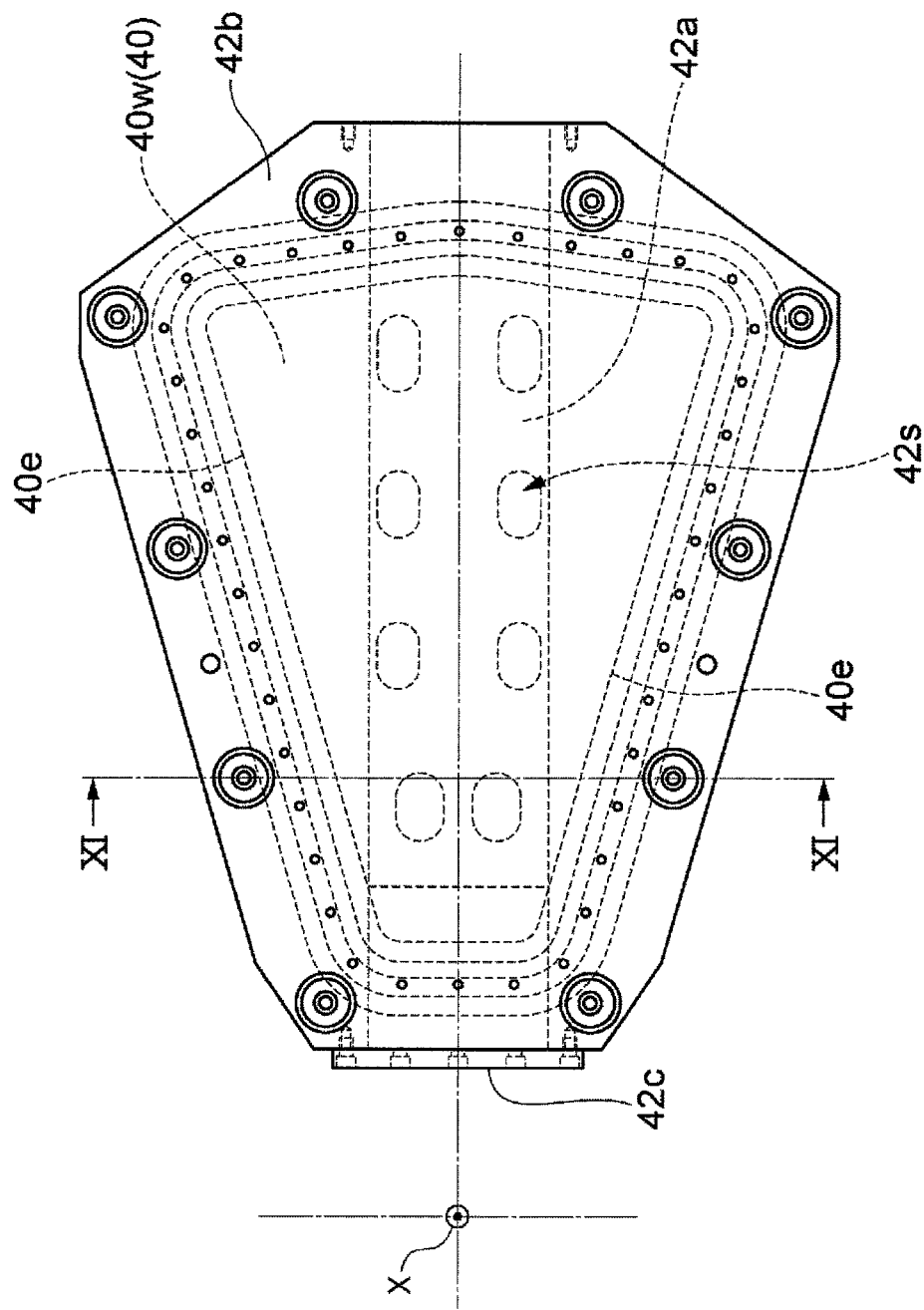
FIG. 10 is a plan view illustrating one antenna of the film formation device according to the exemplary embodiment, which is viewed from the top.
Figure 11:
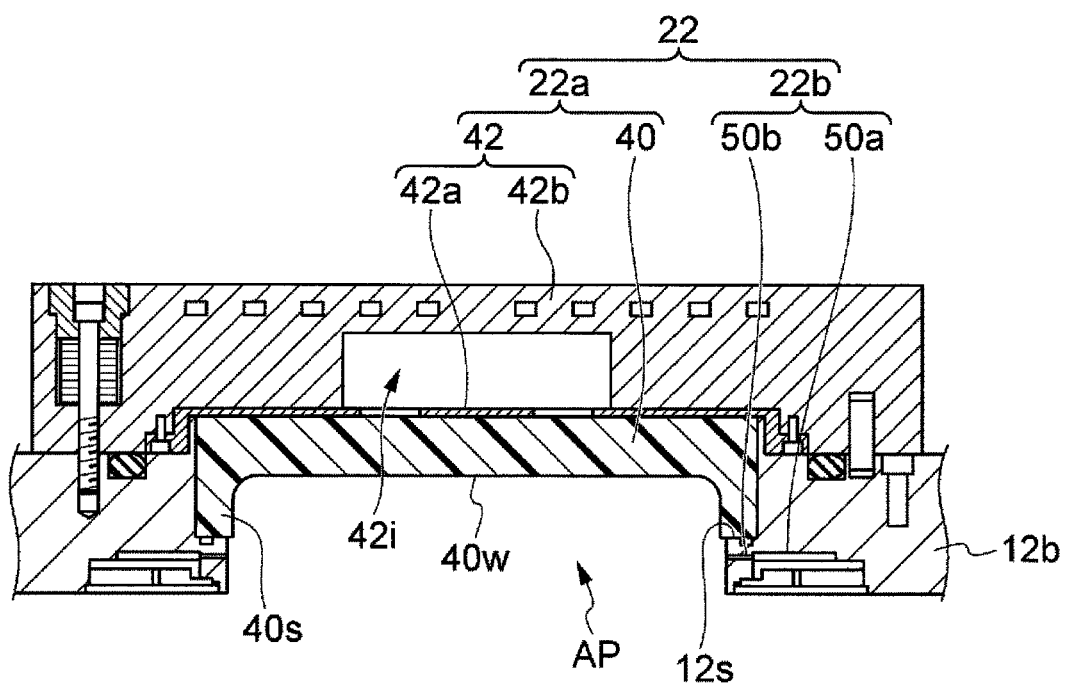
FIG. 11 is a cross-sectional view taken along line XI-XI of FIG. 10.

Here, reference will be further made to FIGS. 10 and 11. FIG. 10 is a plan view illustrating one antenna of the film formation device according to the exemplary embodiment, which is viewed from the top. FIG. 11 is a cross-sectional view taken along line XI-XI of FIG. 10. As illustrated in FIGS. 9 to 11, the dielectric plate 40 is a substantially plate-shaped member made of a dielectric material such as quartz. The dielectric plate 40 is installed to face the second region R2 and supported by the upper portion 12b of the processing container 12.

Specifically, an opening AP is formed in the upper portion 12b of the processing container 12 so as to expose the dielectric plate 40 to the second region R2. A planar size of the upper portion of the opening AP (a size in a plane crossing the axis X) is larger than a planar size of the lower portion of the opening AP (a size in a plane crossing the axis X). Accordingly, a step surface 12s facing upward is formed in the upper portion 12b defining the opening AP. Meanwhile, the edge of the dielectric plate 40 functions as a supported portion 40s and is in contact with the step surface 12s. The supported portion 40s is in contact with the step surface 12s to support the dielectric plate 40 on the upper portion 12b. Further, an elastic sealing member may be installed between the step surface 12s and the dielectric plate 40.

As described above, the dielectric plate 40 supported by the upper portion 12b faces the mounting table 14 with the second region R2 interposed therebetween. A portion exposed from the opening AP of the upper portion 12b, that is, a portion facing the second region R2 of the lower surface of the dielectric plate 40 functions as a dielectric window 40w. Two edges 40e which come closer to each other as they approach the axis X are included in the edges of the dielectric window 40w. Due to the shape of the dielectric window 40w, that is, a shape in which a length in the circumferential direction is increased as being spaced away from the axis X, the variation in the lengths of time of exposing respective positions of the substrate W to the plasma of the reaction gas may be reduced. In addition, a planar shape of the dielectric plate 40 including the dielectric window 40w and the supported portion 40s may be substantially a fan shape, and further, may be a polygonal shape so that the dielectric plate 40 may be easily machined.

A waveguide 42 is installed on the dielectric plate 40. The waveguide 42 is a rectangular waveguide, and installed on the dielectric plate 40 so that an internal space 42i where the microwaves are propagated extends in a substantially radial direction with respect to the axis X above the dielectric window 40w. In an exemplary embodiment, the waveguide 42 may include a slot plate 42a, an upper member 42b, and an end member 42c.

The slot plate 42a is a plate-shaped member made of a metal material, and defines the internal space 42i of the waveguide 42 from the lower side. The slot plate 42a is in contact with and covers the top surface of the dielectric plate 40. The slot plate 42a has a plurality of slot holes 42s in the portion defining the internal space 42i.

On the slot plate 42a, the upper member 42b made of the metal is installed to cover the slot plate 42a. The upper member 42b defines the internal space 42i of the waveguide 42 from the upper side. The upper member 42b may be screw-fixed to the upper portion 12b so that the slot plate 42a and the dielectric plate 40 are sandwiched between the upper member 42b and the upper portion 12b of the processing container 12.

The end member 42c is a metallic member, and installed on one end in a length direction of the waveguide 42. That is, the end member 42c is attached to the slot plate 42a and one end of the upper member 42b so as to close one end of the internal space 42i. A microwave generator 48 is connected to the other end of the waveguide 42. The microwave generator 48 generates, for example, microwaves of about 2.45 GHz so as to supply the microwaves to the waveguide 42. The microwaves generated by the microwave generator 48 to be propagated in the waveguide 42 pass through the slot holes 42s of the slot plate 42a to be supplied to the dielectric plate 40, and are supplied to the second region R2 through the dielectric window 40w. In an exemplary embodiment, the microwave generator 48 may be commonly used with respect to a plurality of waveguides 42. Further, in another exemplary embodiment, a plurality of microwave generators 48 may be connected to the plurality of waveguides 42, respectively. When one or more microwave generators 48 connected to the plurality of antennas 22a are used as described above and the strength of the microwaves generated by the microwave generator 48 is adjusted, the strength of the microwaves applied to the second region R2 may be increased.

Further, the plasma generation unit 22 includes a third gas supply unit 22b. The third gas supply unit 22b supplies a reaction gas to the second region R2. The reaction gas may be, for example, $N_2$ gas or $NH_3$ gas, in a case where a Si-containing precursor gas chemically adsorbed on the substrate W is nitrified as described above. In an exemplary embodiment, the third gas supply unit 22b may include a gas supply path 50a and an injection port 50b. The gas supply path 50a is formed in, for example, the upper portion 12b of the processing container 12 to extend around the opening AP. Further, an injection port 50b configured to inject the reaction gas supplied to the gas supply path 50a toward the bottom of the dielectric window 40w is formed in the upper portion 12b of the processing container 12. In the exemplary embodiment, a plurality of injection ports 50b may be formed around the opening AP. Further, a gas source 50g of the reaction gas is connected to the gas supply path 50a via a valve 50v and a flow rate controller 50c such as, for example, a mass flow rate controller.

According to the plasma generation unit 22 configured as described above, the reaction gas is supplied to the second region R2 by the third gas supply unit 22b, and further, the microwaves are supplied to the second region R2 by the antenna 22a. As a result, plasma of the reaction gas is generated in the second region R2. In other words, the second region R2 is a region in which the plasma of the reaction gas is generated. As illustrated in FIG. 3, an angular range of the second region R2 extending in the circumferential direction with respect to the axis X is wider than an angular range of the first region R1 extending in the circumferential direction. The precursor gas chemically adsorbed on the substrate W is processed by the plasma of the reaction gas generated from the second region R2. For example, a Si-containing precursor gas chemically adsorbed on the substrate W is nitrified by the plasma processing of $N_2$ gas. Further, an exhaust port 22h is formed in the lower portion 12a of the processing container 12 below the outer peripheral edge of the mounting table 14 as illustrated in FIG. 3. The exhaust device 52 illustrated in FIG. 9 is connected to the exhaust port 22h.

Referring back to FIG. 1, the film formation device 10 may further include a control unit 60 configured to control each element of the film formation device 10. The control unit 60 may be a computer including, for example, a central processing unit (CPU), a memory, and an input apparatus. The control unit 60 may control each element of the film formation device 10 by operating the CPU according to a program stored in the memory. In an exemplary embodiment, the control unit 60 may transmit a control signal to the driving device 24a so as to control the rotation speed of the mounting table 14, transmit a control signal to the power supply connected to the heaters 26 so as to control a temperature of the substrates W, transmit a control signal to the valve 16v and the flow rate controller 16c so as to control the flow rate of the precursor gas, transmit a control signal to the exhaust device 34 so as to control an exhaust amount of the exhaust device 34 connected to the exhaust port 18a, transmit a control signal to the valve 20v and the flow rate controller 20c so as to control a flow rate of the purge gas, transmit a control signal to the microwave generator 48 so as to control power of microwaves, transmit a control signal to the valve 50v and the flow rate controller 50c so as to control a flow rate of the reaction gas, and transmit a control signal to the exhaust device 52 so as to control the exhaust amount of the exhaust device 52.

Hereinafter, a method of processing a substrate using the film formation device 10 will be described. In the following description, it is assumed that a silicon nitride film is generated on a Si substrate by the processing method.

(Substrate Transportation Process)

When a Si substrate W is processed by the film formation device 10, first, the Si substrate W is transported on a substrate mounting region 14a of the mounting table 14 through the gate valve G, by the transporting apparatus such as, for example, a robot arm. In addition, the mounting table 14 is rotated by the driving mechanism 24 and thus the substrate mounting region 14a in which the substrate W is disposed is rotated and moved with the second region R2 as origin.

(Nitrification Process 1)

Subsequently, the substrate W is nitrified. Specifically, a nitrogen-containing reaction gas is supplied to the second region R2 by the third gas supply unit 22b and microwaves from the microwave generator 48 are supplied to the second region R2 through the antenna 22a. As a result, the plasma of the reaction gas is generated in the second region R2. The surface of the substrate W is nitrified by the plasma of the reaction gas.

(Processing Process by Precursor Gas)

Subsequently, the substrate W is moved into the first region R1 with rotation of the mounting table 14. In the first region R1, a precursor gas such as, for example, DCS, is supplied by the first gas supply unit 16. As a result, Si contained in the precursor gas is chemically or physically adsorbed onto the substrate W.

(Purge Process)

Subsequently, the substrate W passes between the first region R1 and the second region R2 with rotation of the mounting table 14. In this case, the substrate W is exposed to the purge gas supplied by the second gas supply unit 20. As a result, the Si-containing precursor gas excessively chemically adsorbed onto the substrate W is removed.

(Nitrification Process 2)

Subsequently, the substrate W is moved into the second region R2 with rotation of the mounting table 14. A nitrogen-containing reaction gas containing nitrogen is supplied to the second region R2 by the third gas supply unit 22b and the microwaves from the microwave generator 48 are supplied to the second region R2 through the antenna 22a. Accordingly, the plasma of the reaction gas is generated in the second region R2. The precursor gas chemically adsorbed onto the surface of the substrate W is nitrified by the plasma of the reaction gas.

With rotation of the mounting table 14, the substrate W is repeatedly subjected to the processing process by the precursor gas, the purge process, and the nitrification process 2. As a result, a silicon nitride film is formed on the substrate W. As described above, in the film formation device 10, the circumferential angular range of the second region R2 is set to be larger than that of the first region R1. Accordingly, a long length of time for processing the substrate W by the plasma of the reaction gas may be taken in a period in which the substrate W is rotated around the axis X one time. As a result, a film formation throughput for the substrate W may be improved.

Hereinafter, the relationship between the length (height) WA of the gap GH between the top surface of the mounting table 14 and the injection port 20a described with reference to FIG. 8 and between the top surface of the mounting table 14 and the exhaust port 18a, and a gap (pitch) between the exhaust port 18a and the injection port 20a, that is, a distance WB will be described. FIGS. 12A, 13A, 14A, and 15A are tables representing a leakage amount of gas to the outside of the first area R1 from the first area R1 and FIGS. 12B, 13B, 14B, and 15B are tables representing an infiltration amount of gas into the first area R1 from the outside of the first area R1 while changing the exhaust amount of the exhaust outlet 18 (that is, the exhaust amount of the exhaust device 34) and the flow rate of the second purge gas in the film formation device 10.

The length (height) WA of the gap GAH and the gap (pitch) between the exhaust port 18a and the injection port 20a when the tables illustrated in FIGS. 12A and 12B to FIGS. 15A and 15B were acquired are as follows.
<FIGS. 12A and 12B>
The length WA of the gap GH: 2 mm
The distance WB between the exhaust port 18a and the injection port 20a: 35 mm
<FIGS. 13A and 13B>
The length WA of the gap GH: 3 mm
The distance WB between the exhaust port 18a and the injection port 20a: 35 mm
<FIGS. 14A and 14B>
The length WA of the gap GH: 2 mm
The distance WB between the exhaust port 18a and the injection port 20a: 4 mm
<FIGS. 15A and 15B>
The length WA of the gap GH: 2 mm
The distance WB between the exhaust port 18a and the injection port 20a: 20 mm.

Further, in order to acquire Tables illustrated in FIGS. 12A and 12B to FIGS. 15A and 15B, $O_2$ gas was supplied to the first region R1 as a substitute of the precursor gas from the injection unit 16a, exhaust from the exhaust port 18a was performed, and further, Ar gas was supplied from the second gas supply unit 20, and $N_2$ gas was supplied from the third gas supply unit 22b. The flow rate of the $O_2$ gas was set to 500 sccm and the flow rate of the $N_2$ gas was set to 2000 sccm.

Further, in order to acquire Tables A illustrated in FIGS. 12A, 13A, 14A, and 15A, a quadrupole type mass spectrometer was disposed outside the injection port 20a of the second gas supply unit 20 when viewed from the first region R1 in the processing chamber C and the amount of $O_2$ in a gas composition was measured by the quadrupole type mass spectrometer. Further, in order to acquire Tables B illustrated in FIGS. 12B, 13B, 14B, and 15B, the quadrupole type mass spectrometer was disposed in the first region R1 and the amount of $N_2$ in the gas composition was measured by the quadrupole type mass spectrometer. In Tables illustrated in FIGS. 12A and 12B to FIGS. 15A and 15B, "0" represents that the detected $O_2$ amount was 0% (a detection limit or less) in relation to the supplied $O_2$ amount in each Table A, that is, no gas leaked out from the first region R1 and that the detected $N_2$ amount is 0% relative to the supplied $N_2$ in Tables B, that is, no reaction gas infiltrates into the first region R1. Further, "<0.2" represents that the amount of $O_2$ was smaller than 0.2% in each Table A and the ratio of the $N_2$ amount is smaller than 0.2% in Table B. In addition, "<0.5" represents that the amount of $O_2$ is smaller than 0.5% in Table A and the $N_2$ amount is smaller than 0.5% in Table B. Besides, in Tables illustrated in FIGS. 12A and 12B to FIGS. 15A and 15B, a range surrounded by a thick-line frame represents a range where the leakage of the gas from the first region R1 and the infiltration of the reaction gas into the first region R1 were not detected. That is, when an exhaust amount of the exhaust outlet 18 and a gas flow rate of the second gas supply unit 20 corresponding to a range surrounded by a thick line in Tables illustrated in FIGS. 12A and 12B to FIGS. 15A and 15B are used, the leakage of the precursor gas to the outside from the first region R1 and the infiltration of the reaction gas into the first region R1 may be prevented.

Referring to Tables illustrated in FIGS. 12A and 12B and FIGS. 13A and 13B, it is found that in the case where the length WA of the gap GH is 2 mm and 3 mm, the ranges of the exhaust amount of the exhaust device 34 and the gas flow rate of the second gas supply unit 20, in which both the leakage of the gas from the first region R12 and the infiltration of the reaction gas into the first region R1 may be prevented, are different from each other. That is, when the length WA of the gap GH is increased, the ranges of the exhaust amount of the exhaust outlet 18 and the gas flow rate of the second gas supply unit 20, in which both the leakage of the precursor gas to the outside from the first region R1 and the infiltration of the reaction gas into the first region R1 may be prevented, are narrowed.

Further, referring to Tables illustrated in FIGS. 12A and 12B, 14A and 14B, and 15A and 15B, it is found that the ranges of the exhaust amount of the exhaust outlet 18 and the gas flow rate of the second gas supply unit 20, in which both the leakage of the gas to the outside from the first region R1 and the infiltration of the reaction gas into the first region R1 may be prevented, are increased as the distance WB between the exhaust port 18a and the injection port 20a is increased.

Accordingly, it is found that in order to ensure secure range of the exhaust amount of the exhaust outlet 18 and the gas flow rate of the second gas supply unit 20 in which both the leakage of the gas to the outside from the first region R1 and the intrusion of the reaction gas into the first region R1 may be prevented, the distance WB between the exhaust port 18a and the injection port 20a needs to be increased in proportion to the length of the gap GH.

Further, upon comparing Tables illustrated in FIGS. 12A and 12B, 14A and 14B, and 15A and 15B, it is found that when the distance WB between the exhaust port 18a and the injection port 20a is 20 mm or more in the case where the length WA of the gap GH is 2 mm, a sufficient room may be secured in the allowance ranges of the exhaust amount of the exhaust device 34 and the gas flow rate of the second gas supply unit 20. In this regard, it is found that it is preferable that the distance WA between the exhaust port 18a and the injection port 20a is 10 or more times of the length WB of the gap GH.

Figure 16:
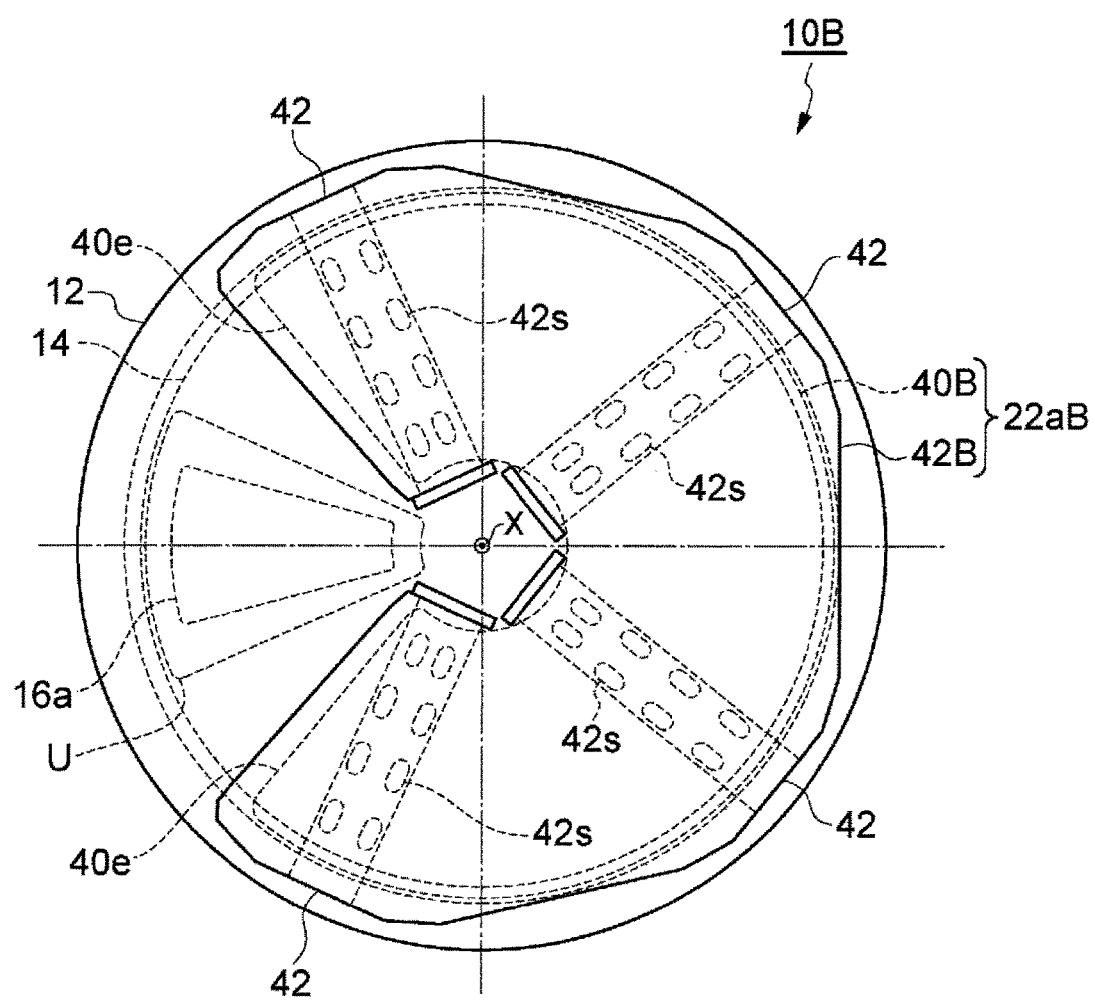
FIG. 16 is a top plan view schematically illustrating a film formation device according to another exemplary embodiment.

Next, reference will be made to FIG. 16. FIG. 16 is a top plan view schematically illustrating a film formation device according to another exemplary embodiment. The film formation device 10B illustrated in FIG. 16 is different from the film formation device 10 in that the film formation device 10B includes a single antenna 22aB. The antenna 22aB includes a single dielectric plate 40B and a waveguide unit 42B configured to provide a plurality of waveguides 42. The dielectric plate 40B has a configuration in which the plurality of dielectric plates 40 of the film formation device 10 is integrated. The dielectric plate 40B has two edges 40e that come closer to each other as approaching the axis X, and extends between the two edges 40e. Further, an angular range of the dielectric plate 40B extending in the circumferential direction is larger than an angular range of one dielectric plate 40 extending in the circumferential direction in the film formation device 10 and is substantially equal to the circumferential angular range of the second region R2. The dielectric plate 40B may, for example, extend in an angular range of 180° or more in the circumferential direction around the axis X.

The waveguide unit 42B has a configuration, in which a plurality of slot plates 42a and a plurality of upper members 42b of the film formation device 10 are integrated, and provides the plurality of waveguides 42. As described above, an antenna having a configuration, in which the plurality of waveguides 42 is installed on the single dielectric plate 40B, may be used. Further, in another exemplary embodiment, a single waveguide 42 may be installed on the single dielectric plate 42B.

Figure 17:
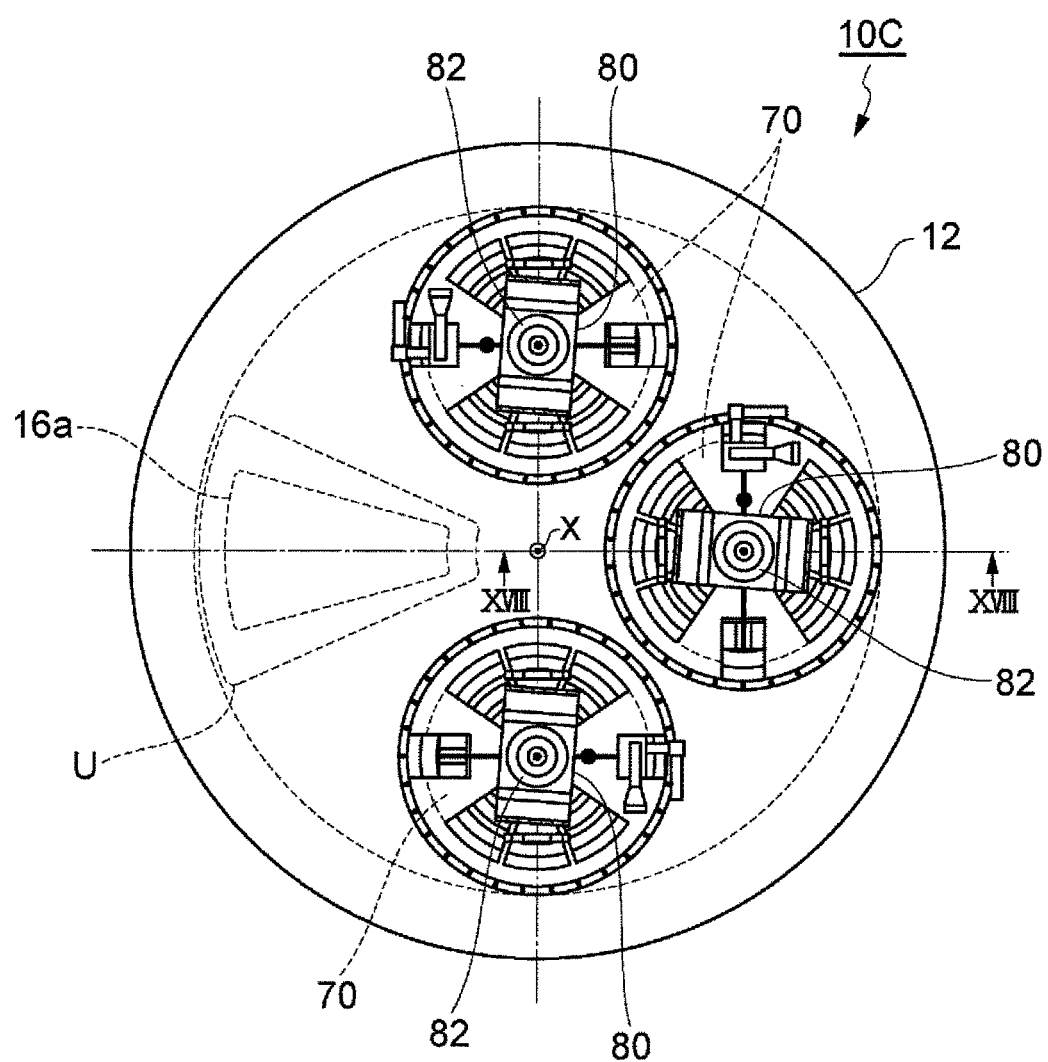
FIG. 17 is a top plan view schematically illustrating a film formation device according to yet another exemplary embodiment.
Figure 18:
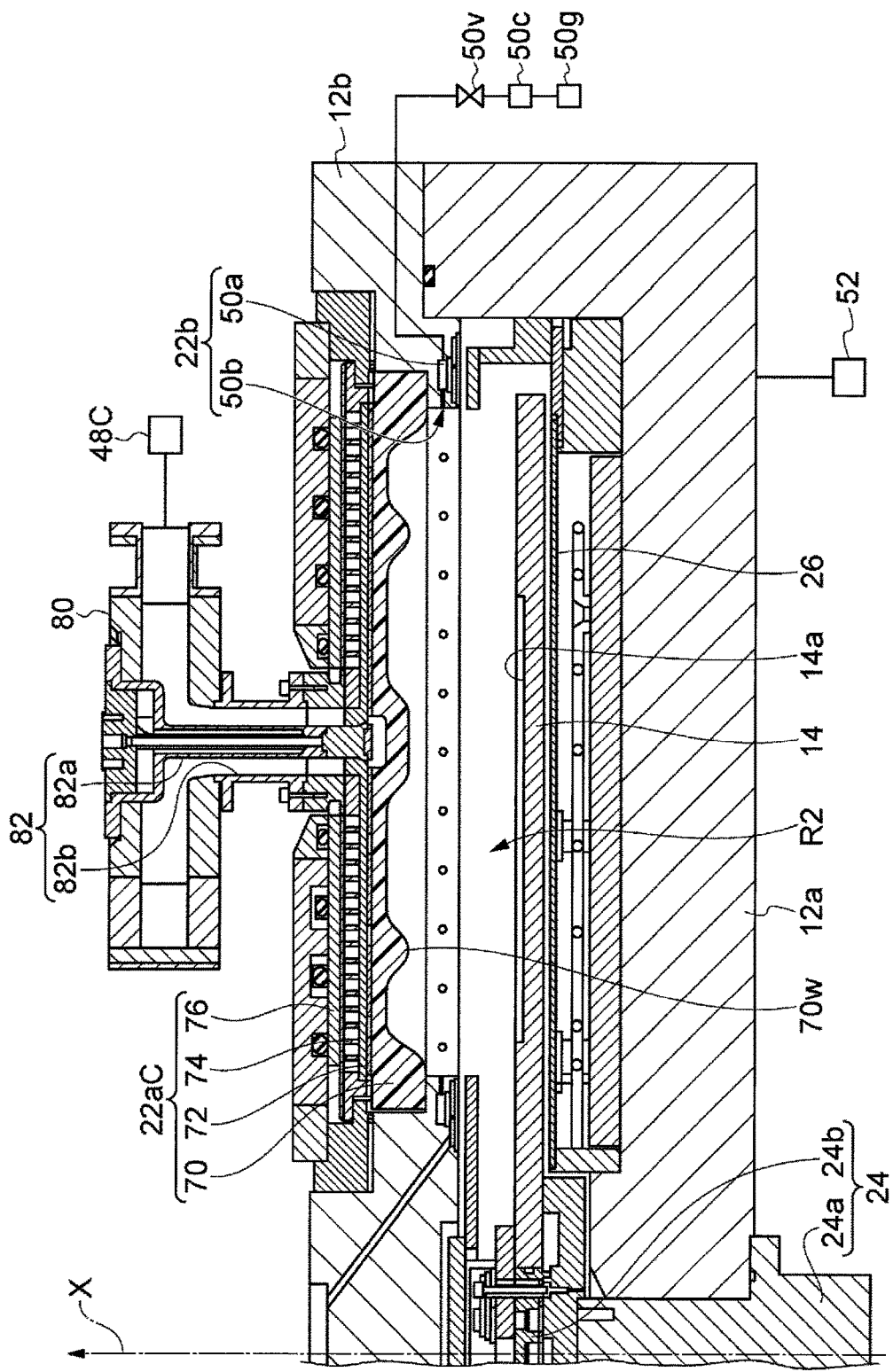
FIG. 18 is a cross-sectional view taken along line XVIII-XVIII illustrated in FIG. 17.

Next, reference will be made to FIGS. 17 and 18. FIG. 17 is a top plan view schematically illustrating a film formation device according to still another exemplary embodiment. FIG. 18 is a cross-sectional view taken along line XVIII-XVIII illustrated in FIG. 17. The film formation device 10C illustrated in FIGS. 17 and 18 is different from the film formation device 10 in that the film formation device 10C includes one or more antennas 22aC each of which is called a radial slot line antenna. In the exemplary embodiment illustrated in FIGS. 17 and 18, the film formation device 10C includes three antennas 22aC.

Each of the antennas 22aC includes a dielectric plate 70, a slot plate 72, a dielectric plate 74, and a cooling jacket 76. The dielectric plate 70 is a substantially disk-shaped dielectric member and is made of, for example, alumina ceramic. The dielectric plate 70 is supported by the upper portion 12b in such a manner that the bottom of the dielectric plate 70 is exposed to the second region R2 from an opening AP formed in the upper portion 12b of the processing container 12. A part in the bottom of the dielectric plate 70, which is exposed to the second region R2, serves as a dielectric window 70w. The dielectric window 70w has a substantially circular plane shape.

The slot plate 72 is installed on the dielectric plate 70. The slot plate 72 is a substantially disk-like metallic member. A plurality of slot pairs is formed in the slot plate 72. Each slot pair includes two slot holes that are perpendicular to each other or cross each other. The slot pairs are arranged in a radial direction and a circumferential direction around a central axis of the slot plate 72. Further, the dielectric plate 74 is installed on the slot plate 72. The dielectric plate 74 is a substantially disk-shaped dielectric member and is made of, for example, alumina ceramic. The cooling jacket 76 is installed on the dielectric plate 74. Coolant flows in a flow path formed in the cooling jacket 76 so as to cool the antenna 22aC. The surface of the cooling jacket 76 is a metallic surface and the dielectric plate 74 is interposed between the top surface of the slot plate 72 and the bottom surface of the cooling jacket 76.

The film formation device 10C further includes a microwave generator 48C, a waveguide 80, and a coaxial waveguide 82. The microwave generator 48C generates microwaves of, for example, approximately 2.45 GHz. The microwaves are propagated to the coaxial waveguide 82 through the waveguide 80. The coaxial waveguide 82 includes an inner conductor 82a and an outer conductor 82b. The inner conductor 82a extends in the axial (X) direction and the bottom end of the inner conductor 82a is connected to the slot plate 72. Further, the outer conductor 82b has a substantially tubular shape and the bottom end of the outer conductor 82b is connected to the surface of the cooling jacket 76.

According to the film formation device 10C, the microwaves generated by the microwave generator 48C and propagated through the waveguide 80 and the coaxial waveguide 82 are supplied to the dielectric plate 70 from the slot holes of the antenna 22aC and supplied to the second region R2 from the dielectric window 70w. Further, the reaction gas is supplied to the second region R2 from the third gas supply unit 22b. Accordingly, even in the film formation device 10C, precursor chemically adsorbed onto the substrate W may be subjected to plasma processing of the reaction gas.

Further, the present invention is not limited to the aforementioned exemplary embodiments and various modified aspects may be configured. A processing performed in the second region R2 is a nitrification processing in the aforementioned exemplary embodiments. However, an oxidation processing may be performed in the second region R2. In this case, the third gas supply unit 22b may supply an oxygen-containing gas to the second region R2. Further, the supply may be adjusted depending on an area ratio, of the first region R1 and the second region R2 or an adsorption efficiency or a plasma processing efficiency therein.

DESCRIPTION OF REFERENCE NUMERALS

10: Film formation device
12: Processing container
14: Mounting table
14a: Substrate mounting region
16: First gas supply unit (gas supply unit of precursor gas)
16a: Injection unit
16h: Injection port
18: Exhaust outlet
18a: Exhaust port
20: Second gas supply unit (gas supply unit of purge gas)
20a: Injection port
22: Plasma generation unit
22a: Antenna
22b: Third gas supply unit (gas supply unit of reaction gas)
40: Dielectric plate
40e: Edge
40w: Dielectric window
42: Waveguide
42s: Slot hole
48: Microwave generator
60: Control unit
C: Processing chamber
R1: First region
R2: Second region
X: Axis (rotational axis)

The invention claimed is:

1. A film formation device comprising:
 a mounting table including a substrate mounting region and installed to be rotatable about an axis such that the substrate mounting region moves in a circumferential direction around the axis;
 a processing container configured to define a processing chamber including a first region and a second region, the substrate passing through the first region and the second region in this order while moving in the circumferential direction around the axis by rotation of the mounting table, and the processing chamber accommodating the mounting table;
 a first gas supply unit configured to supply a precursor gas to the first region from an injection unit installed to face the mounting table;
 an exhaust outlet configured to perform ventilation from an exhaust port formed to extend along a closed path which surrounds a periphery of the injection unit;
 a second gas supply unit configured to supply a purge gas from the injection port formed to extend along a closed path which surrounds a periphery of the exhaust port; and
 a plasma generation unit configured to generate plasma of a reaction gas in the second region,
 wherein an angular range of the second region extending in the circumferential direction around the axis is larger than an angular range of the first region extending in the circumferential direction around the axis, and wherein the first region is a region facing the injection unit and the second region is a region facing the plasma generation unit which supplies the reaction gas to the second region.

2. The film formation device of claim 1, wherein both a size of the injection port and a size of the exhaust port are smaller than a size of the substrate mounting region.

3. The film formation device of claim 1, wherein the injection unit provides a plurality of injection ports, and the plurality of injection ports is distributed between two edges that come closer to each other as approaching the axis.

4. The film formation device of claim 1, wherein the plasma generation unit includes: a third gas supply unit configured to supplies reaction gas to the second region; and
one or more antennas configured to supply microwaves to the second region, each of the one or more antennas includes:
a dielectric plate installed to face the mounting table with the second region interposed therebetween, and
at least one waveguide installed on the dielectric plate and formed with a slot that allows the microwaves to pass therethrough toward the dielectric plate, and the dielectric plate has a dielectric window contacting the second region and the dielectric window includes two edges that extend in a direction crossing the axis and come closer to each other as approaching the axis.

5. The film formation device of claim 4, wherein the plasma generation unit has a plurality of antennas arranged in the circumferential direction as the one or more antennas.

6. The film formation device of claim 4, wherein the plasma generation unit includes a single antenna as the one or more antennas, and the single antenna is installed on a single dielectric plate and includes a plurality of waveguides arranged in the circumferential direction as the at least one waveguide.

7. The film formation device of claim 1, wherein the exhaust port and the injection port are provided in an upper unit which is provided above the mounting table, wherein a gap is formed between a lower surface of the upper unit and the mounting table at a location between the exhaust port and the injection port, and a distance between the exhaust port and the injection port of the second gas supply unit is 10 or more times of the length of the gap.

* * * * *